(12) United States Patent
Sheynblat et al.

(10) Patent No.: US 6,677,894 B2
(45) Date of Patent: *Jan. 13, 2004

(54) METHOD AND APPARATUS FOR PROVIDING LOCATION-BASED INFORMATION VIA A COMPUTER NETWORK

(75) Inventors: Leonid Sheynblat, Belmont, CA (US); Norman F. Krasner, San Carlos, CA (US)

(73) Assignee: Snaptrack, Inc, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/201,672

(22) Filed: Nov. 30, 1998

(65) Prior Publication Data

US 2002/0171581 A1 Nov. 21, 2002

Related U.S. Application Data

(63) Continuation-in-part of application No. 09/067,406, filed on Apr. 28, 1998, now Pat. No. 6,185,427.

(51) Int. Cl.[7] ............................. G01S 5/14; H04M 11/08
(52) U.S. Cl. ............................. 342/357.1; 455/414.3; 455/456.3; 455/456.5
(58) Field of Search ..................... 342/357.03, 357.09, 342/357.1; 701/215; 455/414.2, 414.3, 456.2, 456.5, 456.3

(56) References Cited

U.S. PATENT DOCUMENTS

| 4,445,118 A | 4/1984 | Taylor et al. ............... 343/357 |
| 4,601,005 A | 7/1986 | Kilvington ................. 364/602 |
| 4,622,557 A | 11/1986 | Westerfield ................. 342/357 |

(List continued on next page.)

FOREIGN PATENT DOCUMENTS

| CA | 1277400 | | 12/1990 | | |
| EP | 0242099 | | 10/1987 | | |
| EP | 0379198 | | 7/1990 | | |
| EP | 0512789 | | 11/1992 | | |
| EP | 0601293 | | 6/1994 | | |
| EP | 0785535 | * | 7/1997 | .......... | G08G/1/968 |
| EP | 0829704 | | 3/1998 | | |
| FR | 2761837 A1 | * | 10/1998 | | |
| JP | 09-311177 A | * | 12/1997 | | |
| JP | 09311177 | * | 12/1997 | ............. | G01S/5/14 |
| WO | WO9428434 | | 12/1994 | | |
| WO | WO9714054 | | 4/1997 | | |
| WO | WO-97/14054 A1 | * | 4/1997 | | |

OTHER PUBLICATIONS

Moore, T et al, "Satellite Navigation Information Services", IEE Colloquim on Implementation of GNSS, 1995, pp6/1–6/5.*

PCT International Search Report for Int'l appln No. PCT/US96/16159 mailed Feb. 6, 1997.

"RTCM Recommended Standards for Differential Navstar GPS Service, Version 2.0," *Radio Technical Commission for Maritime Services*, Jan. 1, 1990.

(List continued on next page.)

*Primary Examiner*—Gregory C. Issing
(74) *Attorney, Agent, or Firm*—Philip Wadsworth; Charles Brown; Bruce W. Greenhaus

(57) ABSTRACT

Methods and apparatuses for distributing location-based information (i.e., information specific to a client's location or a location of interest to the client) to a client, which may be a mobile SPS receiver, via the Internet and in particular, the World-Wide Web. The client provides information about its location and/or a location of interest to a Web server. The Web server, based on the information, provides via the Internet information relating to the client's location or location of interest to the client.

30 Claims, 13 Drawing Sheets

U.S. PATENT DOCUMENTS

| | | | |
|---|---|---|---|
| 4,701,934 A | 10/1987 | Jasper | 375/1 |
| 4,785,463 A | 11/1988 | Janc et al. | 375/1 |
| 4,797,677 A | 1/1989 | MacDoran et al. | 342/352 |
| 4,959,656 A | 9/1990 | Kumar | 342/418 |
| 4,998,111 A | 3/1991 | Ma et al. | 342/352 |
| 5,043,736 A | 8/1991 | Darnell et al. | 342/357 |
| 5,119,102 A | 6/1992 | Barnard | 342/357 |
| 5,202,829 A | 4/1993 | Geier | 364/449 |
| 5,223,844 A | 6/1993 | Mansell et al. | 342/357 |
| 5,225,842 A | 7/1993 | Brown et al. | 342/357 |
| 5,271,034 A | 12/1993 | Abaunza | 375/1 |
| 5,311,194 A | 5/1994 | Brown | 342/357 |
| 5,317,323 A | 5/1994 | Kennedy et al. | 342/457 |
| 5,323,163 A | 6/1994 | Maki | 342/357 |
| 5,365,450 A | 11/1994 | Schuchman et al. | 364/449 |
| 5,379,047 A | 1/1995 | Yokev et al. | 342/457 |
| 5,379,224 A | 1/1995 | Brown et al. | 364/449 |
| 5,379,320 A | 1/1995 | Fernandes et al. | 375/1 |
| 5,416,797 A | 5/1995 | Gilhousen et al. | 375/705 |
| 5,418,538 A | 5/1995 | Lau | 342/357 |
| 5,420,592 A | 5/1995 | Johnson | 342/357 |
| 5,430,759 A | 7/1995 | Yokev et al. | 375/202 |
| 5,483,549 A | 1/1996 | Weinberg et al. | 375/200 |
| 5,519,403 A | 5/1996 | Bickley et al. | 342/352 |
| 5,543,789 A | 8/1996 | Behr et al. | 340/995 |
| 5,636,122 A | 6/1997 | Shah et al. | 364/449.1 |
| 5,652,570 A | 7/1997 | Lepkofker | 340/573 |
| 5,663,734 A | 9/1997 | Krasner | 342/357 |
| 5,757,916 A | 5/1998 | MacDoran et al. | 380/25 |
| 5,928,306 A * | 7/1999 | France et al. | 701/207 |
| 6,014,090 A * | 1/2000 | Rosen et al. | 304/905 |
| 6,070,078 A * | 5/2000 | Camp, Jr. et al. | 455/456 |
| 6,199,045 B1 * | 3/2001 | Giniger et al. | 705/1 |
| 6,240,360 B1 * | 5/2001 | Phelan | 701/208 |
| 6,331,825 B1 * | 12/2001 | Ladner et al. | 340/988 |

OTHER PUBLICATIONS

Peterson, et al. "GPS Receiver Structures for the Urban Canyon," ION–GPS–95, Session C4, Land Vehicular Applications, Palm Springs, CA, Sep. 1995.

Raab, et al. "An Application of the Global Positioning System to Search and Rescue and Remote Tracking," *Navigation: Journal of the Institute of Navigation*, 24:3, 1977.

Amateur Radio Catalog, Summer 1996, pp. 52–55.

Cortland, Laurence J. "Loran–C Vehicle Tracking in Detroit's Public Safety Dispatch System," *Journal of the Institute of Navigation*, 36:3, Fall 1989.

Rogers & Anson, "Animal–borne GPS: Tracking the Habitat," *GPS World*, pp. 21 & 22, Jul. 1994.

"Navstar GPS User Equipment, Introduction," *NATO*, Feb. 1991 (entire volume).

"Navigation: Journal of the Institute of Navigation," *The Institute of Navigation*, 25:2, 1978 (entire edition).

PCT International Search Report for Int'l Appln No. PCT/US99/07988 mailed Sep. 21, 1999.

Moore, T., et al., Satellite Navigation Information Services; IEE Colloquim On Implementation Of GNNS, 1995, pp. 6/1–6/5.

Written Opinion for PCT/US99/07988, 5 pages.

* cited by examiner

METHOD AND APPARATUS FOR PROVIDING LOCATION-BASED INFORMATION VIA A COMPUTER NETWORK

CROSS REFERENCES TO RELATED APPLICATIONS

The application is a continuation-in-part of U.S. patent application Ser. No. 09/067,406 entitled "Distributed Satellite Position System Processing and Application Network", filed on Apr. 28, 1998, now U.S. Pat. No. 6,185,427, and assigned to the assignee of the present invention.

BACKGROUND OF THE INVENTION

The present invention relates to processing data in a satellite positioning system (SPS), such as the Global Positioning System (GPS), and more particularly relates to methods and apparatuses for distributing location-based information that may be associated with a SPS.

SPS receivers, such as those which operate in GPS or other satellite positioning systems, normally determine their position by computing relative times of arrival of signals transmitted simultaneously from a multiplicity of satellites, such as GPS, NAVSTAR, or other satellites. These satellites typically transmit, as part of their satellite data message, timing and satellite positioning data, which is sometimes referred to as "ephemeris" data. The term "ephemeris" or "satellite ephemeris" is generally used to mean a representation, such as an equation, which specifies the positions of satellites (or a satellite) over a period of time or time of day. In addition, the satellites may transmit data to indicate a reference time, such as time-of-week (TOW) information, that allows a receiver to determine unambiguously local time.

Typically, an SPS receiver computes one or more "pseudorange" measurements, each of which represents the range between the receiver and a satellite vehicle (SV). The term "pseudorange" is generally used to point out that the range measurement may include error due to one or more factors, including, for example, the error between time as indicated by the clock of the SPS receiver and a reference time, such as the reference time associated with the more accurate atomic clock of the satellites. Thus, the SPS receiver typically uses the pseudoranges, along with timing and ephemeris data provided in the satellite signal to determine a more accurate set of navigational data, such as position, time, and/or range. Collecting satellite data, such as ephemeris data, provided in a satellite message requires a relatively strong received signal level in order to achieve low error rates, and may also require a relatively substantial processing time in some systems.

Most GPS receivers utilize correlation methods to compute pseudoranges. These correlation methods are performed in real time, often with hardware correlators. GPS signals contain high rate repetitive signals called pseudorandom (PN) sequences. The codes available for civilian applications are called C/A codes, and have a binary phase-reversal rate, or "chipping" rate, of 1.023 MHz and a repetition period of 1023 chips for a code period of 1 msec. The code sequences belong to a family known as Gold codes. Each GPS satellite broadcasts a signal with a unique Gold code. Alternative methods, as exemplified in U.S. Pat. No. 5,663,734, operate on snapshots of data and utilize fast convolution methods to compute the pseudoranges.

All of the above systems may benefit by communicating with the resources of a remote site, or "server" utilizing a wireless communications system, such as a cellular telephone system. Such a server may provide assistance data to the mobile GPS receivers to enhance their performance, receive data from the GPS receivers and perform further processing on such data to complete or refine a position calculation, etc. In addition, the remote site may include or be connected to various display and application resources, such as a dispatching system to send emergency or repair resources to the user of the GPS mobile, or to provide route guidance or other concierge services.

Thus, the above server may provide two functions: (1) Location Server functions, which provide assistance to the mobile GPS receivers to enhance their performance, and (2) Application Server functions, which display the location of the mobile GPS receiver and provide auxiliary services, such as roadside assistance.

A paper was provided by Raab in 1977 on splitting the functionality of GPS processing between mobile GPS receivers and a remote basestation. See Raab, et al., "An Application of the Global Positioning System to Search and Rescue and Remote Tracking," Navigation, Vol. 24, No. 3, Fall 1977, pp. 216–227. In one method of Raab's paper the remote GPS receiver computes the times of arrival of the satellite signals at the remote GPS receiver (so-called "pseudoranges") and transmits these times-of-arrival to a central site via a data relay where the final position calculation of the mobile is computed. Raab also mentions providing assistance information including approximate time and position to the remote unit. Raab also discusses so-called "retransmission methods" in which the raw GPS signal is relayed directly to the remote basestation.

Other patents, such as U.S. Pat. Nos. 4,622,557, 5,119,102, 5,379,224, and 5,420,592 discuss variations of the retransmission method. U.S. Pat. No. 4,622,557 utilizes an analog retransmission method whereas U.S. Pat. No. 5,119,102, 5,379,224, and 5,420,592 utilize digital means to store and then forward a digitized record of the sampled GPS signal. These patents describe communications between one or more mobile units and a single basestation which may incorporate functions of GPS calculation as well as ancillary functions described above.

The U.S. Pat. No. 4,445,118 by Taylor discusses transmission of aiding data, such as GPS satellites in view from a basestation to remote units via a communication link. In addition, in one variation, a tracking application for trucks, Taylor describes a system in which pseudorange data is sent from the trucks to the remote basestation which computes the final position. Variations on this pseudorange transfer method include U.S. Pat. No. 5,202,829 and 5,225,842. Again, this prior art envisioned a single basestation containing GPS aiding functions as well as display and other ancillary functions.

FIG. 1 shows a block diagram of the prior art which utilizes a basestation to supplement GPS signal processing. Mobile units 12a, 12b, 12c, and 12d in this example contain a combination of a GPS receiver and a wireless modem. Attached to the GPS unit are GPS antennas 10a, 10b, 10c, and 10d for receiving GPS signals from GPS satellites (not shown for simplicity) and antennas 11a, 11b, 11c, and 11d for communication to and from a basestation 20 which includes a basestation antenna 17. In some implementations, this communication may be in one direction only.

Basestation 9 contains a signal processing unit 15 which may provide aid to the mobile GPS units to help them obtain positioning information and/or it may complete or refine the position calculations of these units based upon data transmitted to it from these units, together with auxiliary data which it may gather with its own GPS antenna 18. The signal processing unit 15 may contain its own GPS receiver and GPS antenna in order to determine its own position and provide differential corrections to the data transmitted to it from the mobile GPS units. Basestation 9 also includes a display 14 and computer equipment which is coupled to the signal processing unit 15 by a connection 16 and which allows an operator to visually track the position of the mobiles and provide manual and semiautomatic commands to these units via the aforementioned communications links. In some cases, unit 14 together with signal processing unit 15 is termed a "workstation."

Although FIG. 1 shows a wireless link from each mobile GPS unit to the basestation, this link may actually be a wireless link to a modem, such as one at a cell site followed by a wired or other link to the basestation as shown in FIG. 1. In some implementations, the basestation 9 may actually represent a number of basestations in a reference network.

Unfortunately, in distributed systems, such as the one shown in FIG. 1, the geographical area in which a mobile unit may operate in conjunction with the basestation(s) is generally limited, for example, by the range and distribution of cellular or other communication system transceivers. As such, a mobile GPS unit may not be able to communicate effectively outside of the range provided by the basestation (s), and/or may experience delays in attempting such communication.

Therefore, what is need is an improved method and system for distribution of satellite signal-related and/or location-specific information.

SUMMARY OF THE INVENTION

The present invention provides methods and apparatuses for distributing location-based information (i.e., information specific to a client's location or a location of interest to the client) to a client, which may be a mobile SPS receiver, via the Internet and in particular, the World-Wide Web. In one embodiment, the client provides information associated with its location and/or a location of interest to a Web server. For example, such information may include pseudorange measurements, portions of one or more received satellite messages, user-input data of known or estimated location, etc. The Web server, based on the information, provides via the Internet information relating to the client's location or location of interest to the client.

BRIEF DESCRIPTION OF THE DRAWINGS

The present invention is illustrated by way of example and not limitation in the figures of the accompanying drawings in which like references indicate similar elements.

DETAILED DESCRIPTION

The present invention relates to a distributed processing system for processing GPS information. The following description and drawings are illustrative of the invention and are not to be construed as limiting the invention. Numerous specific details are described to provide a thorough understanding of the present invention. However, in certain instances, well known or conventional details are not described in order to not unnecessarily obscure the present invention.

Figure 2A:
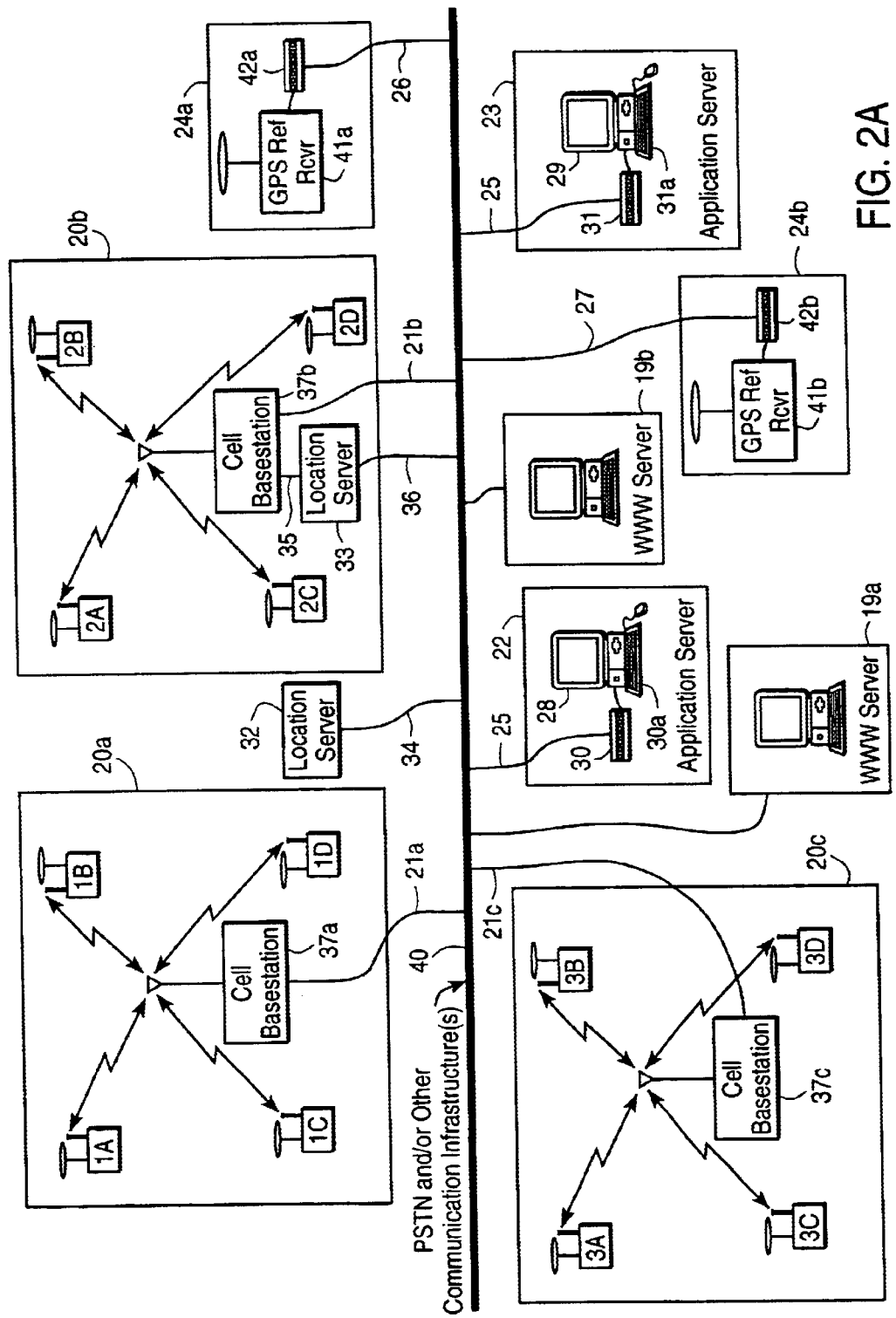
FIG. 2A illustrates an example of a distributed processing system using GPS information, according to one embodiment of the present invention.

FIG. 2A is a block diagram which shows an exemplary architecture for a distributed processing system, according to one embodiment of the invention. This architecture includes cells 20a, 20b, and 20c, each of which includes its respective wireless cell based station ("cell basestation"). Thus, cell basestation 37a performs wireless communications to and from mobile GPS receivers 1a, 1b, 1c, and 1d, each of which includes a wireless communication system, in the cell 20a. Similarly, cell basestation 37b in cell 20b provides 2-way wireless communications with mobile GPS receivers 2a, 2b, 2c, and 2d, each of which includes a wireless communication system such as a cell telephone. The cell 20c includes mobile GPS receivers 3a, 3b, 3c, and 3d which are capable of performing 2-way wireless communications with the cell basestation 37c. It will be understood that in certain embodiments of the invention, some mobile GPS receivers may be capable of only 1-way communications (transmissions to the basestation) wherein the mobile GPS unit determines its position (by determining pseudoranges and reading transmissions of satellite ephemeris data) and transmits the position to an application server. Each cell basestation includes a respective connection (e.g. connections 21a, 21b, or 21c) from the basestation to a communication infrastructure 40.

The network of FIG. 2A contains the following constituent elements:

A. Mobile GPS units (e.g. unit 1a) communicating information to and from wireless basestations using a wireless type communications system.

B. Location servers (e.g. servers 32 or 33) that can communicate with the mobile GPS units via the public switched communication network (PSTN) or other communications infrastructure (e.g. leased lines, satellites, etc.) which in turn can communicate with the wireless basestations (e.g. station 37a).

C. Separate application servers (e.g. servers 22 or 23) that can display the results of location information supplied by the location servers and permit auxiliary services, such as dispatching, to be performed.

D. WWW servers (e.g., WWW servers 19*a* or 19*b*) that can provide location-based information (i.e., information related to a client's location or another location, which, for example, may be of interest to the client) to a client, which may be a mobile GPS unit (e.g., unit 1*a*).

E. A communication infrastructure 40 which may include a public switched telephone network and/or a dedicated network, such as a packet switched data network.

F. Separate GPS reference receivers (e.g. GPS reference stations 24*a* or 24*b*), which can measure ranging information from the GPS satellites over a wide geographical area and receive and process their navigation message data.

In general, all of these network elements can communicate with one another as seen in FIG. 2A. However, in preferred embodiments, the GPS reference receivers communicate with the location servers and the location servers communicate mainly with the application servers and with the WWW servers.

Although each mobile is shown in FIG. 2A to be communicating with one wireless basestation, it should be appreciated that in many mobile telephone situations, for example, a mobile may in fact communicate with a multiplicity of cell basestations, although it is normally the case that only one such basestation at a given instance in time will process most of the information to and from the mobile. Simultaneous communications with multiple basestations allows for rapid handoff from one cell site to the next as the mobile moves from one location to the next. Hence, a given mobile in cell 20*a*, for example, might be monitoring the emissions of the basestation within its cell as well as a basestation within a neighboring cell such as cell 20*b*. It would perform the bulk of its communications with cell 20*a* until a handover occurred, in which case it would perform the bulk of its communications with cell 20*b*.

An aspect of the current invention is the separation of the location servers, as exemplified by 32 and 33, from the application servers 22 and 23. It should be appreciated that the location servers themselves may only consist of software components that are resident on other processing systems attached to the wireless network. Such processing systems may perform other functions such as voice and data messaging and WWW services. The location server software then may utilize existing computational components associated with these services and not utilize a processor solely for its own use. In other configurations, the location server may consist of an embedded circuit board in a multiprocessor computer. This configuration may ensure a desired throughput capability of the server. In preferred embodiments, the location server is autonomous and has no display or operator interaction functions, other than those required for occasional fault testing.

Figure 1:
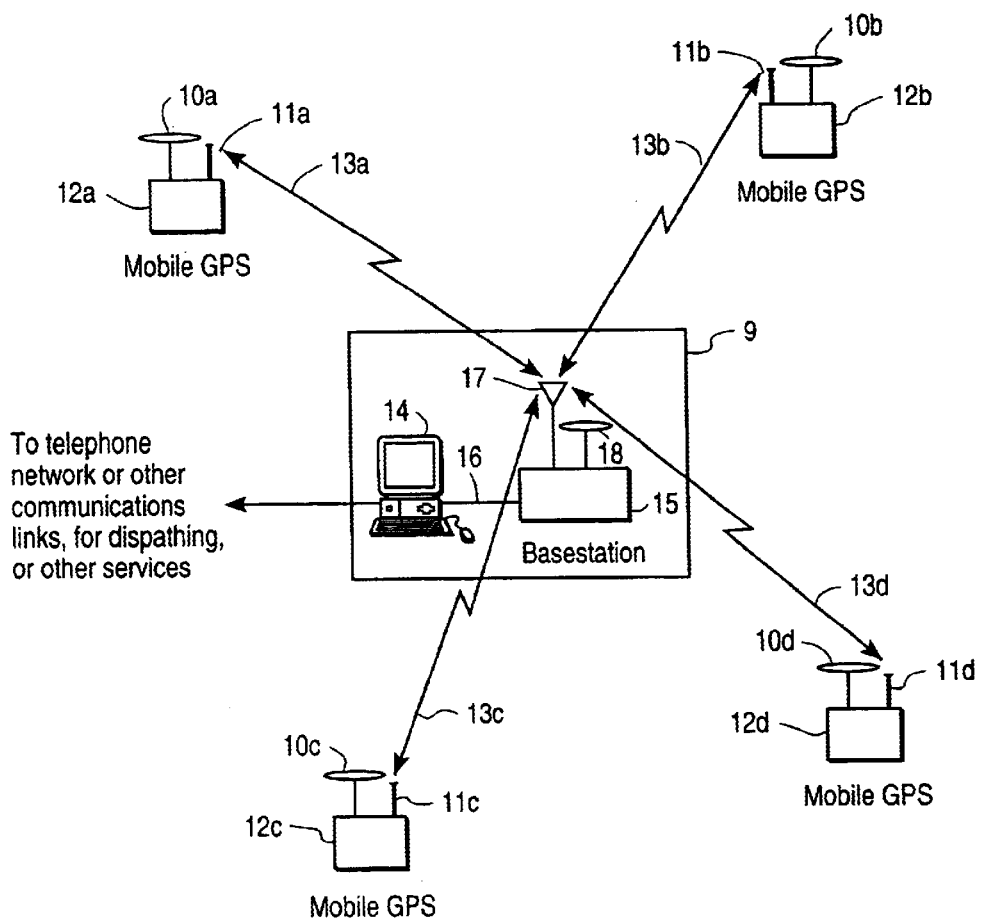
FIG. 1 shows a prior art GPS tracking system.

In FIG. 2A, location server 33 is physically located within the same cell site as the mobile units in cell 20*b*. Server 32, however, is not located within any of the cells shown, but can service the data from cells 20*a*, 20*b* and 20*c*. In fact, even server 33 could process data from cells 20*a* and 20*c*, although server 32 may be preferred for this task due to its geographical proximity. Utilizing a network of servers as shown in FIG. 2A provides reliability and redundancy which is important in emergency response applications. Furthermore, in emergency response applications there may be a flood of calls for service, which could overload a star-based system such as in FIG. 1. The network approach of FIG. 2A overcomes these bottlenecks.

In another embodiment, the WWW server may act as a proxy server for an application server. In such capacity, the WWW server acts as an entry point for information to be relayed to and from the application server.

In many GPS configurations utilizing basestation assistance it is necessary to coordinate time between the mobile units and the basestations. For example, coordination of time between the mobile and basestation to 10 millisecond accuracy can allow the basestation to perform final position calculations based upon pseudoranges supplied to it with a small error on the order of several meters (see, for example, the cited paper by Raab, Section 7, page 226). Without such time coordination the basestation will estimate the position of the GPS satellites (e.g. from its own GPS receiver) at an incorrect time relative to the time at which the mobile is making its measurements. Since the satellites are moving rapidly, this erroneous position of the GPS satellites translates to an error in the position calculation of the mobile, when this calculation is done at the basestation. One solution to this problem is to locate the location server in proximity to the mobiles, e.g. at a switching center (termed a Mobile Switching Center, MSC). Thus, the path delay from the mobile to the location server may be short, as compared to a single basestation which may be located thousands of miles away. In a CDMA wireless network configuration, for example, a CDMA signal may be used to provide time coordination between the mobile unit and the basestation.

Another example of the utility of the architecture of FIG. 2A is in applications for emergency response, such as wireless 911 capability. In such applications the application servers of FIG. 2A are termed Public Safety Answering Points (PSAP's) and may be numerous in number when servicing a metropolitan area. A location server, such as server 32, would in this case service a number of cell sites and route location data to such PSAP's. Additional Application Servers may be utilized in such a situation to act as an intermediary between the location server and the PSAP's. For example, such application servers may perform the latitude/longitude to street address transformation. Hence, in this application there may be two classes of application servers. The redundancy and distribution of the location and application servers in this case provide much greater reliability than would be possible with the star topology of the prior art of FIG. 1.

Figure 2B:
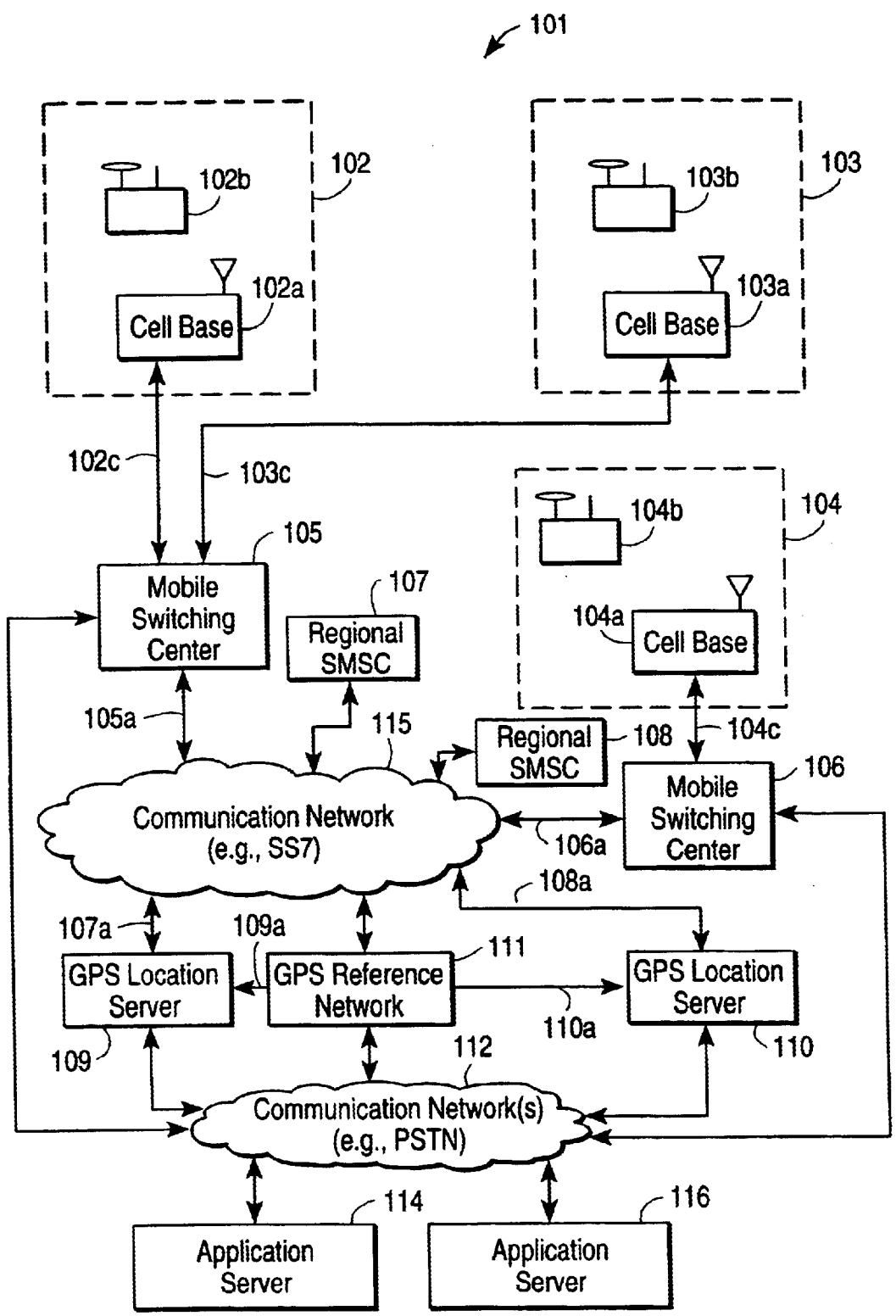
FIG. 2B shows another example of a distributed processing system using GPS information, according to one embodiment of the present invention.

FIG. 2B shows another example of a distributed GPS processing system 101 of the invention which is used with a cell based wireless communication system which includes a plurality of cell sites, each of which is designed to service a particular geographical region or location. Examples of such cellular based or cell based communication systems are well known in the art, such as the cell based telephone systems. The cell based communication system 101 includes three cells 102, 103, and 104. It will be appreciated that a plurality of other cells with corresponding cell sites and/or cellular service areas may also be included in the system 101 and coupled to one or more cell based switching centers, such as the mobile switching center 105 and the mobile switching center 106, each of which is coupled to a public switched telephone network (PSTN) 112.

Within each cell, such as the cell 102, there is a wireless cell basestation (or base) such as cell basestation 102*a* which is designed to communicate through a wireless communication medium with a communication receiver which may be combined with a mobile GPS receiver to provide a combined system such as the receiver 102*b* shown in FIG.

Figure 4:
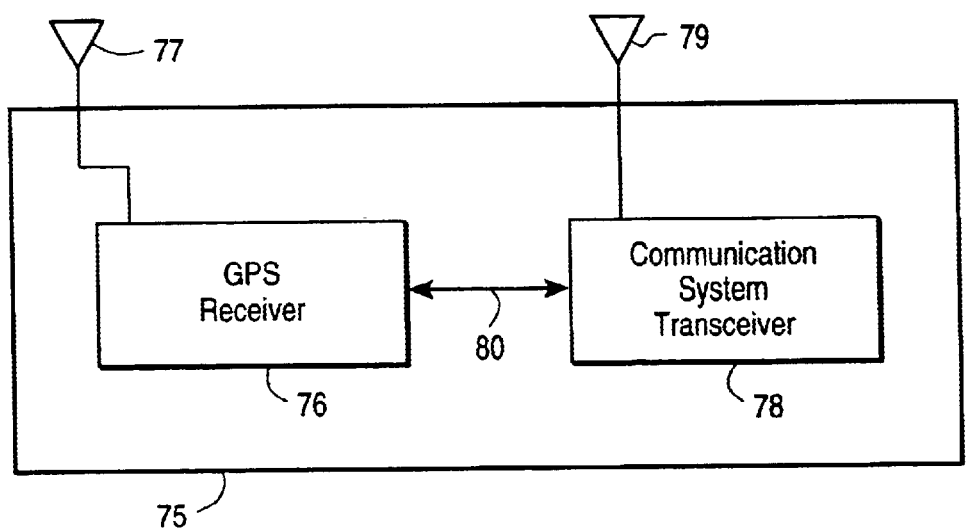
FIG. 4 depicts an example of a combined GPS receiver and communication system, according to one embodiment of the present invention.

2B. An example of such a combined system having a GPS receiver and a communication system is shown in FIG. 4 and may include both a GPS antenna 77 and a communication system antenna 79.

Each cell site is coupled to a mobile switching center. In FIG. 2B, cell bases 102a and 103a are coupled to switching center 105 through connections 102c and 103c respectively, and cell base 104a is coupled to a different mobile switching center 106 through connection 104c. These connections are typically wire line connections between the respective cell base and the mobile switching centers 105 and 106. Each cell base includes an antenna for communicating with communication systems serviced by the cell site. In one example, the cell site may be a cellular telephone cell site which communicates with mobile cellular telephones in the area serviced by the cell site.

In a typical embodiment of the present invention, the mobile GPS receiver, such as receiver 102b, includes a cell based communication system which is integrated with the GPS receiver such that both the GPS receiver and the communication system are enclosed in the same housing. One example of this is a cellular telephone having an integrated GPS receiver which shares common circuitry with the cellular telephone transceiver. When this combined system is used for cellular telephone communications, transmissions occur between the receiver 102b and the cell base 102a. Transmissions from the receiver 102b to the cell base 102a are then propagated over the connection 102c to the mobile switching center 105 and then to either another cellular telephone in a cell serviced by the mobile switching center 105 or through a connection (typically wired) to another telephone through the land-based telephone system/network 112. It will be appreciated that the term wired includes fiber optic and other non wireless connections such as copper cabling, etc. Transmissions from another telephone which is communicating with the receiver 102b are conveyed from the mobile switching center 105 through the connection 102c and the cell base 102a back to the receiver 102b in the conventional manner.

In the example of FIG. 2B, each mobile switching center (MSC) may be coupled to at least one regional short message service center (SMSC) through a communication network 115 which in one embodiment is referred to as a Signaling System Number 7 (SS7) Network. This network is designed to allow short messages (e.g. control information and data) to be passed among elements of the telephone network. It will be understood that FIG. 2B shows one example and that it is possible for several MSC's to be coupled to one regional SMSC. Alternatively, other communication networks may be used, and gateway interfaces in the network may be used to interconnect the MSC's to various GPS location servers. The example of FIG. 2B also shows two GPS location servers 109 and 110 which are respectively coupled to regional SMSC 107 and regional SMSC 108 and to the mobile switching centers 105 and 106 through the communications network 115. In one embodiment of the distributed system of FIG. 2B, the connections 107a and 108a are part of a permanent communication network which interconnects various MSC's and regional SMSC's with various GPS location servers. This allows each regional SMSC to act as a router to route requests for location services to whichever GPS location servers are available in case of congestion at a location server or failure of a location server. Thus, regional SMSC 107 may route location service requests from mobile GPS receiver 102b (e.g. the user of mobile GPS receiver 102b dials 911 on the integrated cell telephone) to the GPS location server 110 if location server 109 is congested or has failed or is otherwise unable to service the location service request. While an SS7 network and a PSTN network are shown in FIG. 2B as examples of communication networks which are used to interconnect various components of the overall system, it will be appreciated that these networks may use any of a number of different types of networks and may in fact be one network (e.g. networks 115 and 112 are combined together as one network such as the PSTN). Each network may be a circuit switched data network or a digital packet switched data network. Each network may include gateway interfaces which interface between the various components coupled to the network. In one example of the embodiment of FIG. 2B, each SMSC operates as a gateway interface.

Each GPS location server is typically coupled to a wide area network of GPS reference stations which provide differential GPS corrections and satellite ephemeris and typically other data to the GPS location servers. This wide area network of GPS reference stations, shown as GPS reference network 111, is typically coupled to each GPS location server through a data network. The data network which supplies data from the network of GPS reference stations may be part of the communication network 112 or communication network 115 or may be a separate data network having connections 109A and 110A as shown in FIG. 2B. Hence, location server 109 receives data from the network 111 through connection 109a and server 110 receives data from network 111 through connection 110a. As shown in FIG. 2B, each GPS location server is also coupled to another communication network 112, such as a public switched telephone network (PSTN) to which two application servers 114 and 116 are coupled.

Either of the two GPS location servers may be used, in one embodiment, to determine the position of a mobile GPS receiver (e.g. receiver 102b) using GPS signals received by the mobile GPS receiver.

Each GPS location server will receive pseudoranges from a mobile GPS receiver and satellite ephemeris data from the GPS reference network and calculate a position for the mobile GPS receiver and then this position will be transmitted through the PSTN to one (or both) of the Application Servers where the position is presented (e.g. displayed on a map) to a user at the Application Server. Normally, the GPS location server calculates but does not present (e.g. by display) the position at the GPS location server. An application server may send a request, for the position of a particular GPS receiver in one of the cells, to a GPS location server which then initiates a conversation with a particular mobile GPS receiver through the mobile switching center in order to determine or refine the position of the GPS receiver and report that position back to the particular application. In another embodiment of the invention, an application server may initiate a conversation with a particular mobile GPS unit through an MSC and provide the pseudoranges to the location server for position determination or refinement. In yet another embodiment, a position determination for a GPS receiver may be initiated by a user of a mobile GPS receiver; for example, the user of the mobile GPS receiver may press 911 on the cell phone to indicate an emergency situation at the location of the mobile GPS receiver and this may initiate a location determination or refinement process in a manner described herein.

It should be noted that a cellular based or cell based wireless communication system is a communication system which has more than one transmitter, each of which serves a different geographical area, which is predefined at any instant in time. Typically, each transmitter is a wireless transmitter which serves a cell which has a geographical radius of less than 20 miles, although the area covered depends on the particular communication system. There are numerous types of cell-based communication systems, such as cellular telephones, PCS (personal communication system), SMR (specialized mobile radio), one-way and two-way pager systems, RAM, ARDIS, and wireless packet data systems. Typically, the predefined geographical areas are referred to as cells and a plurality of cells are grouped together into a cellular service area and these pluralities of cells are coupled to one or more cellular switching centers which provide connections to land-based telephone systems and/or networks. A service area is often used for billing purposes. Hence, it may be the case that cells in more than one service area are connected to one switching center. Alternatively, it is sometimes the case that cells within one service area are connected to different switching centers, especially in dense population areas. In general, a service area is defined as a collection of cells within close geographical proximity to one another. Another class of cell-based systems that fits the above description is satellite based, where the cellular basestations or cell sites are satellites that typically orbit the earth. In these systems, the cell sectors and service areas move as a function of time. Examples of such systems include Iridium, Globalstar, Orbcomm, and Odyssey.

Figure 3:
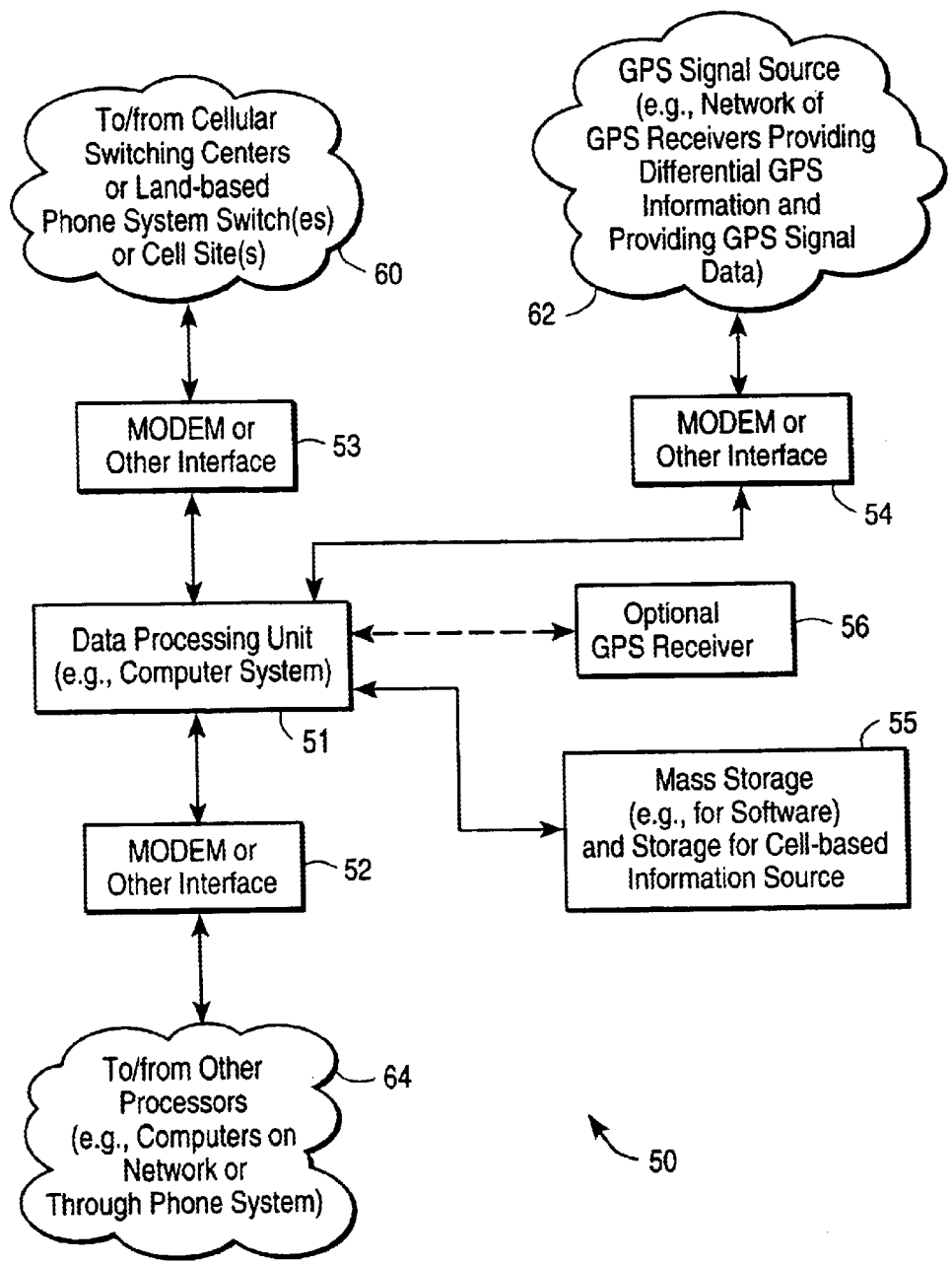
FIG. 3 illustrates an implementation of a location server system, according to one embodiment of the invention.

FIG. 3 shows an example of a GPS location server 50 which may be used as the GPS server 109 or GPS server 110 in FIG. 2B. The GPS server 50 of FIG. 3 includes a data processing unit 51 which may be a fault-tolerant digital computer system. The SPS server 50 also includes a modem or other communication interface 52 and a modem or other communication interface 53 and a modem or other communication interface 54. These communication interfaces provide connectivity for the exchange of information to and from the location server shown in FIG. 3 between three different networks, which are shown as networks 60, 62, and 64. The network 60 includes the mobile switching center or centers and/or the land-based phone system switches or the cell sites. An example of this network is shown in FIG. 2B wherein the GPS server 109 represents the server 50 of FIG. 3. Thus the network 60 may be considered to include the mobile switching centers 105 and 106 and the cells 102, 103, and 104. The network 64 may be considered to include the Applications Servers 114 and 116, which are each usually computer systems with communication interfaces, and also may include one or more "PSAP's," (Public Safety Answering Point) which is typically the control center which answers 911 emergency telephone calls. The network 62, which represents the GPS reference network 111 of FIG. 2B, is a network of GPS receivers which are GPS reference receivers designed to provide differential GPS correction information and also to provide GPS signal data including the satellite ephemeris data to the data processing unit. When the server 50 serves a very large geographical area or provides redundant backup to other location servers which are very remote from it, a local optional GPS receiver, such as optional GPS receiver 56, may not be able to observe all GPS satellites that are in view of mobile SPS receivers throughout this area. Accordingly, the network 62 collects and provides satellite ephemeris data (typically as part of the entire raw satellite navigation message) and differential GPS correction data over a wide area in accordance with the present invention.

As shown in FIG. 3, a mass storage device 55 is coupled to the data processing unit 51. Typically, the mass storage 55 will include storage for software for performing the GPS position calculations after receiving pseudoranges from the mobile GPS receivers, such as a receiver 102*b* of FIG. 2B. These pseudoranges are normally received through the cell site and mobile switching center and the modem or other interface 53. Alternatively, this storage can be used to provide differential corrections to position calculations provided by the mobile GPS receivers. The mass storage device 55 also includes software, at least in one embodiment, which is used to receive and use the satellite ephemeris data (typically as part of the entire raw satellite navigation message) provided by the GPS reference network 32 through the modem or other interface 54.

In a typical embodiment of the present invention, the optional GPS receiver 56 is not necessary as the GPS reference network 111 of FIG. 2B (shown as network 62 of FIG. 3) provides differential GPS information as well as the raw satellite data messages from the satellites in view for the various reference receivers in the GPS reference network. It will be appreciated that the satellite ephemeris data obtained from the network through the modem or other interface 54 may be used in a conventional manner with the pseudoranges obtained from the mobile GPS receiver in order to compute the position information for the mobile GPS receiver. The interfaces 52, 53, and 54 may each be a modem or other suitable communication interface for coupling the data processing unit to other computer systems, as in the case of network 64, and to cellular based communication systems, as in the case of network 60, and to transmitting devices, such as computer systems in the network 62. In one embodiment, it will be appreciated that the network 62 includes a dispersed collection of GPS reference receivers dispersed over a geographical region. In some embodiments, the differential correction GPS information, obtained from a receiver 56 near the cell site or cellular service area which is communicating with the mobile GPS receiver through the cellular based communication system, will provide differential GPS correction information which is appropriate for the approximate location of the mobile GPS receiver. In other cases, differential corrections from the network 62 may be combined to compute a differential correction appropriate to the location of the mobile GPS receiver. In one embodiment, the GPS receiver 56 is operable to provide raw satellite navigation message information (e.g., received at 50 bps) and timing information in a form of 1 (one) PPS output.

FIG. 4 shows a generalized combined system which includes a GPS receiver and a communication system transceiver. In one example, the communication system transceiver is a cellular telephone. In another example, the communication system transceiver is a modem. The system 75 includes a GPS receiver 76 having a GPS antenna 77 and a communication transceiver 78 having a communication antenna 79. The GPS receiver 76 is coupled to the communication transceiver 78 through the connection 80 shown in FIG. 4. In one mode of operation, the communication system transceiver 78 receives approximate Doppler information through the antenna 79 and provides this approximate Doppler information over the link 80 to the GPS receiver 76 which performs the pseudorange determination by receiving the GPS signals from the GPS satellites through the GPS antenna 77. The determined pseudoranges are then transmitted to a GPS location server through the communication system transceiver 78. Typically the communication system transceiver 78 sends a signal through the antenna 79 to a cell site which then transfers this information back to the GPS location server. Examples of various embodiments for the system 75 are known in the art. For example, U.S. Pat. No. 5,663,734 describes an example of a combined GPS receiver and communication system which utilizes an improved GPS receiver system. Another example of a combined GPS and communication system has been described in co-pending application Ser. No. 08/652,833, which was filed May 23, 1996. The system 75 of FIG. 4, as well as numerous alternative communication systems having SPS receivers, may be employed with the methods of the present invention to operate with the computer network of the present invention.

Figure 5:
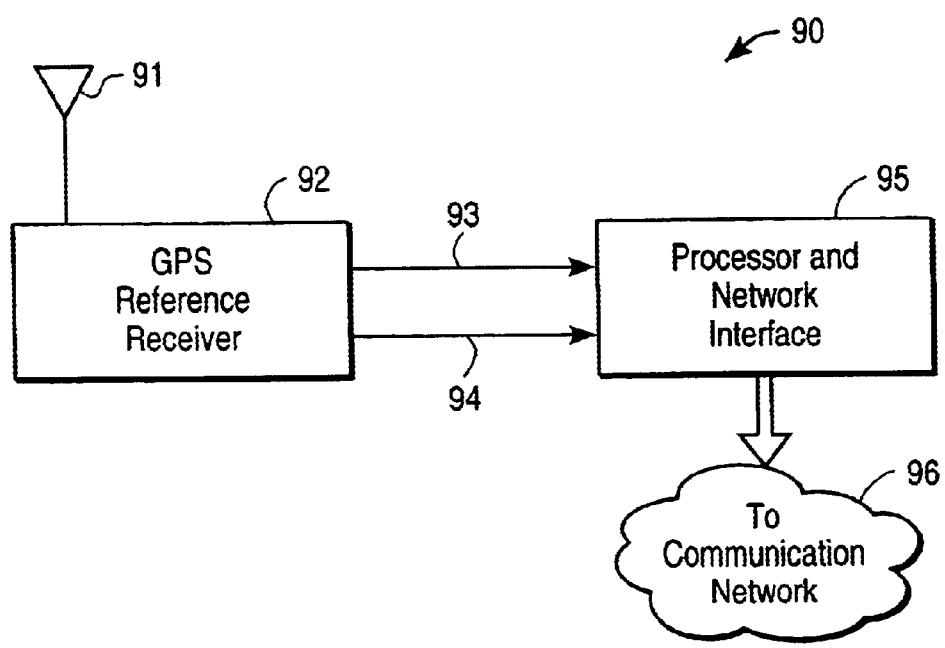
FIG. 5 illustrates an example of a GPS reference station, according to one embodiment of the invention.

FIG. 5 shows one embodiment for a GPS reference station. It will be appreciated that each reference station may be constructed in this way and coupled to the communication network or medium. Typically, each GPS reference station, such as GPS reference station 90 of FIG. 5, will include a dual frequency GPS reference receiver 92 which is coupled to a GPS antenna 91 which receives GPS signals from GPS satellites in view of the antenna 91. GPS reference receivers are well known in the art. The GPS reference receiver 92, according to one embodiment of the present invention, provides at least two types of information as outputs from the receiver 92. Satellite measurement outputs 93 (such as pseudoranges and/or range-rates) are provided to a processor and network interface 95, and these satellite measurement outputs are used to compute pseudorange and/or range-rate differential corrections in the conventional manner for those satellites in view of the GPS antenna 91. The processor and network interface 95 may be a conventional digital computer system which has interfaces for receiving data from a GPS reference receiver as is well known in the art. The processor 95 will typically include software designed to process the pseudorange data to determine the appropriate pseudorange correction for each satellite in view of the GPS antenna 91. These pseudorange corrections are then transmitted through the network interface to the communication network or medium 96 to which other GPS reference stations are typically also coupled. The GPS reference receiver 92 also provides a satellite ephemeris data output 94. This data is provided to the processor and network interface 95 which then transmits this data onto the communication network 96, which is included in the GPS reference network 111 of FIG. 2B.

The satellite ephemeris data output 94 provides typically at least part of the entire raw 50 baud navigation binary data encoded in the actual GPS signals received from each GPS satellite. This satellite ephemeris data is part of the navigation message which is broadcast as the 50 bit per second data stream in the GPS signals from the GPS satellites and is described in great detail in the GPS ICD-200 document. The processor and network interface 95 receives this satellite ephemeris data output 94 and transmits it in real time or near real time to the communication network 96. As will be described below, this satellite ephemeris data which is transmitted into the communication network is later received through the network at various GPS location servers according to aspects of the present invention.

In certain embodiments of the present invention, only certain segments of the navigation message, such as the satellite ephemeris data message may be sent to location servers in order to lower the bandwidth requirements for the network interfaces and for the communication network. Typically, this data may not need to be provided continuously. For example, only the first three frames which contain ephemeris information rather than all 5 frames together may be transmitted on a regular basis into the communication network 96. It will be appreciated that in one embodiment of the present invention, the location server may receive the entire navigation message which is transmitted from one or more GPS reference receivers into the network in order to perform a method for measuring time related to satellite data messages, such as the method described in co-pending U.S. patent application Ser. No. 08/794,649, which was filed Feb. 3, 1997, by Norman F. Krasner. As used herein, the term "satellite ephemeris data" includes data which is only a portion of the satellite navigation message (e.g. 50 baud message) transmitted by a GPS satellite or at least a mathematical representation of this satellite ephemeris data. For example, the term satellite ephemeris data refers to at least a representation of a portion of the 50 baud data message encoded into the GPS signal transmitted from a GPS satellite. It will be also understood that the GPS reference receiver 92 decoded the different GPS signals from the different GPS satellites in view of the reference receiver 92 in order to provide the binary data output 94 which contains the satellite ephemeris data.

Communication Methodologies and Protocols

The distributed architecture requires reliable and timely message passing methods. In addition, it requires reliable methods for ensuring that the overall network achieves prescribed throughput, reliability, latency, node and subscriber management functions. It should be adaptable and allow for growth in the number of nodes and allow for user authentication and network health monitoring. Many of these requirements are either absent or are more simply provided in a single localized processing system, which is the current state of the art.

The distributed architecture is designed to utilize a combination of existing data communication technologies between the network nodes of the distributed system including the mobile GPS unit. The architecture does not preclude the use of future communication systems and protocols as they become available.

The distributed architecture is adaptable to allow different system functionality as required by a particular use. Technology specific information may be encoded in the messaging protocols and this information is used to specify different system functionality. For example, the technology specific information may include the type of location service (e.g. emergency 911 vs. concierge service), the type of radio technology (e.g. CDMA), the type or vendor of the mobile unit, the base station's address, and/or the server vendor. This information is used to control how the distributed architecture of the present invention functions. For example, information concerning the type of location service will typically determine its processing and routing priority; location processing of emergency 911 calls will typically receive highest priority at a location server relative to location processing of other location processing requests such as concierge services. Similarly, the 911 calls will typically also be routed at the fastest possible rate through the network of the distributed architecture by labeling data for such calls as 911 call type of location service in order to route such data as high (e.g. the highest) priority data to be transmitted and switched through the network as quickly as possible.

The communication between network nodes may use implementations of the ISO/OSI seven layer model, with appropriate mapping to real world elements according to the communication system being used. For example, if the communication system uses Signaling System Number 7 (SS7) as defined by ANSI then the commonly defined mapping of layers for that protocol is used within the system. The requirement for such protocols greatly distinguishes a distributed system from one in which all processing and display is handled at a single location. Such single location systems typically do not have or require any message passing mechanisms or packet data protocols, let alone a distributed message passing system.

Mobile GPS Unit to Location Server Messages

The functioning of the system requires the passing of messages between the mobile GPS unit and the Location Server to perform part of the positioning operation. Depending on the application, the exchange of messages can be initiated by either entity. The messages are defined at a high level (application layer) such that they are abstracted from the underlying communication system as much as possible. Hence, a number of communication systems can be supported by this interface.

In consideration of the mobile GPS unit working in a cellular network the communication system used could be any of the following (or a combination thereof):

- Dial-up connection using analog modems at mobile GPS unit and location server
- SS7 signaling connection
- Digital circuit switched data
- Packet switched data, e.g. CDPD, GPRS (GSM), USSD (GSM)
- Short Message Service (SMS)
- DTP (Wireless Application Forum transport protocol)

This list is not complete and exhaustive so other communications systems are possible. The application level messaging can be supported in a connection oriented or connectionless communication system.

The above description does not dictate a direct communication path between the mobile GPS unit and the location server; in fact, there may be intermediate nodes which may in addition perform protocol conversion. For example, the mobile GPS unit may communicate with a Mobile Switching Center (MSC) via a basestation sub-system, and a separate communication then occurs between the MSC and the location server.

Location Server/Application Server Messages

These elements communicate using message passing. The messages are defined at an application layer level abstracted from the underlying communication systems used to transport them. The communication between the location server and the application server can be connection-oriented or connectionless. For connection-oriented communication the connection may be made for each transaction or group of related transactions or it may be a permanent connection; this will be dictated by the requirements of the applications.

The communication systems to be used will be those commonly used in Local Area Networks (LAN) and Wide Area Networks (WAN). The most likely protocol stack to be used for the application layer messaging is TCP/IP and a number of underlying transport mechanisms are possible such as:

- Frame relay
- Ethernet
- Dial-up networking
- ISDN
- X.25
- Internet

This list is not exhaustive and does not preclude other protocols or transport mechanism.

In one particular embodiment, data is transmitted between processing units on the network by packetizing data into separate packets. A transmitting unit, such as a location server, will determine how to packetize its original data and then transmit it through the network to an application server (which can then display the position of a mobile GPS receiver). This application server receiving the packets of data re-assembles the original data from the received packets.

Location Server/Reference Receiver Wide Area Network Messages

In one embodiment, the location servers interconnect with a single reference receiver or a wide area network of reference receivers using methods as defined above.

Node Addressing

The addressing scheme used for setting up communication between network nodes is constrained by the communication system used.

The addresses typically include directory numbers, IP addresses, X.25 addresses, X.400 addresses, and/or SS7 point codes, but do not preclude others. The network communication systems may utilize address translation transparently to the network nodes described here or the network nodes themselves may be responsible for address translation and selection of node addresses.

For security, capacity and redundancy reasons the architecture supports multiple routes for communication. This may be managed by the communication system such that it is transparent to the network node, or this may be the responsibility of the network node.

Latency

The network topology, the network nodes and the communication systems used are designed such that latency is kept within acceptable limits to provide the required performance to the location application.

Where appropriate (e.g. emergency calls such as 911 calls) positioning transactions can be allocated a high priority and processed accordingly to reduce latency in providing a location.

Fault Tolerance/Redundancy

The required level of fault tolerance and redundancy in network elements will be dictated by a number of factors according to the location-based application and such factors as economics and regulatory requirements. The architecture is flexible such that a number of approaches can be used to meet these requirements.

The location server and application server are mainly software functions that are executed on computers within this network. A number of techniques are compatible with these elements to aid reliability, including fault tolerant computers, high availability systems and the use of redundant systems. For the latter case, several configurations are envisaged for management of redundancy such as master/slave, load-shared pair with mutual monitoring and multiple systems with voting.

In addition, the architecture supports fault tolerance and redundancy in the communication systems used. The communication protocols and supporting networks provide differing levels of fault tolerance, redundancy and error recovery.

Network Management

The network nodes of the architecture are capable of being managed by a remote network management system which can itself be distributed or centralized. The network management system allows the remote control and configuration of network nodes in the distributed location-based application network.

The application servers and, for some services, the location servers, can be managed with respect to service features from a remote service management system which can itself be distributed or centralized.

The service management system is used to configure application data, perform subscriber management and support external information systems related to the applications.

Figure 6:
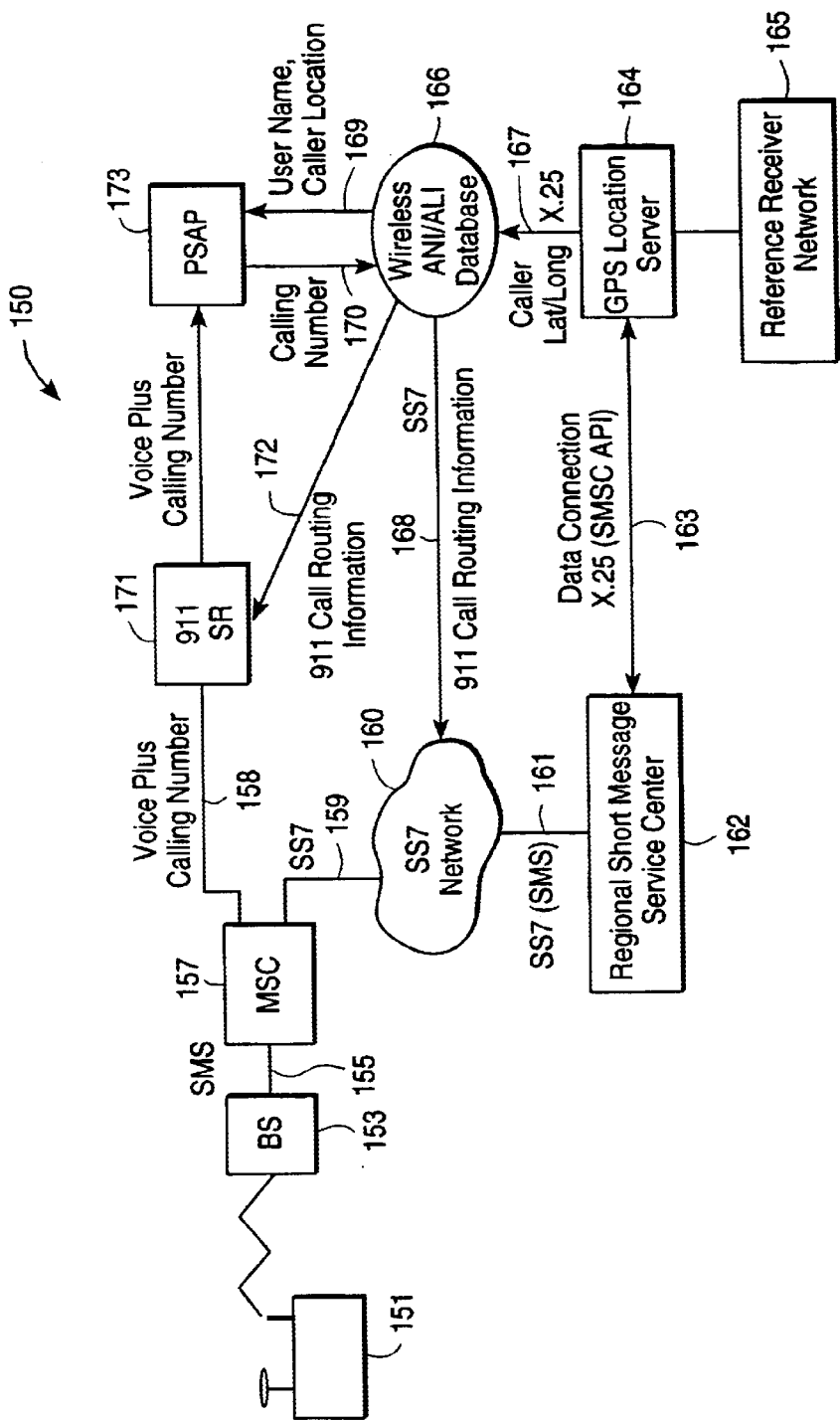
FIG. 6 shows an example of a distributed system for processing GPS information in a "911" situation.

FIG. 6 shows another example of a distributed processing system for processing GPS information in the context of the E911 application. The architecture shown in FIG. 6 is for a regional E911 system. It includes several mobile GPS receivers, one of which is shown as mobile GPS receiver 151 which is similar to the receiver shown in FIG. 4. This receiver is in wireless communication with a cell basestation 153 which is coupled by connection 155 to a mobile switching center 157. The mobile switching center is coupled through the telephone network 158 to a 911 switch router 171. The mobile switching center 157 is also coupled through an SS7 network (shown with reference numerals 159, 160, 161 and 168) to a regional SMSC 162. The regional SMSC 162 is coupled by a data network 163 to a GPS location server 164, which itself is coupled to a reference receiver network 165, which is similar to the GPS reference network 111 of FIG. 2B. The location server 164 is similar to the GPS location server 109 or 110 of FIG. 2B. Similarly, the mobile switching center 157 and the regional SMSC 162 are similar to the respective elements of FIG. 2B. A position calculation is performed by the GPS location server after receiving pseudoranges from the mobile GPS receiver 151 through the mobile switching center 157 and the regional SMSC 162. These pseudoranges, along with the satellite ephemeris data received from the GPS reference receiver network 165 are used to calculate the position of the mobile GPS receiver in the GPS location server 164. This position is typically calculated but not displayed or otherwise presented at the GPS location server 164. The position is then transmitted over a data network 167 to a location database server 166 which receives the calling number via the connection 170 from the PSAP 173. The location database server 166 then correlates the location determined by the location server with the user's name (the user/owner of the mobile GPS receiver 151 which initiated the location request) and provides the user name and location over the connection 169 to the PSAP 173. The operation of the system 150 shown in FIG. 6 will be further described below in conjunction with FIG. 8.

Figure 7:
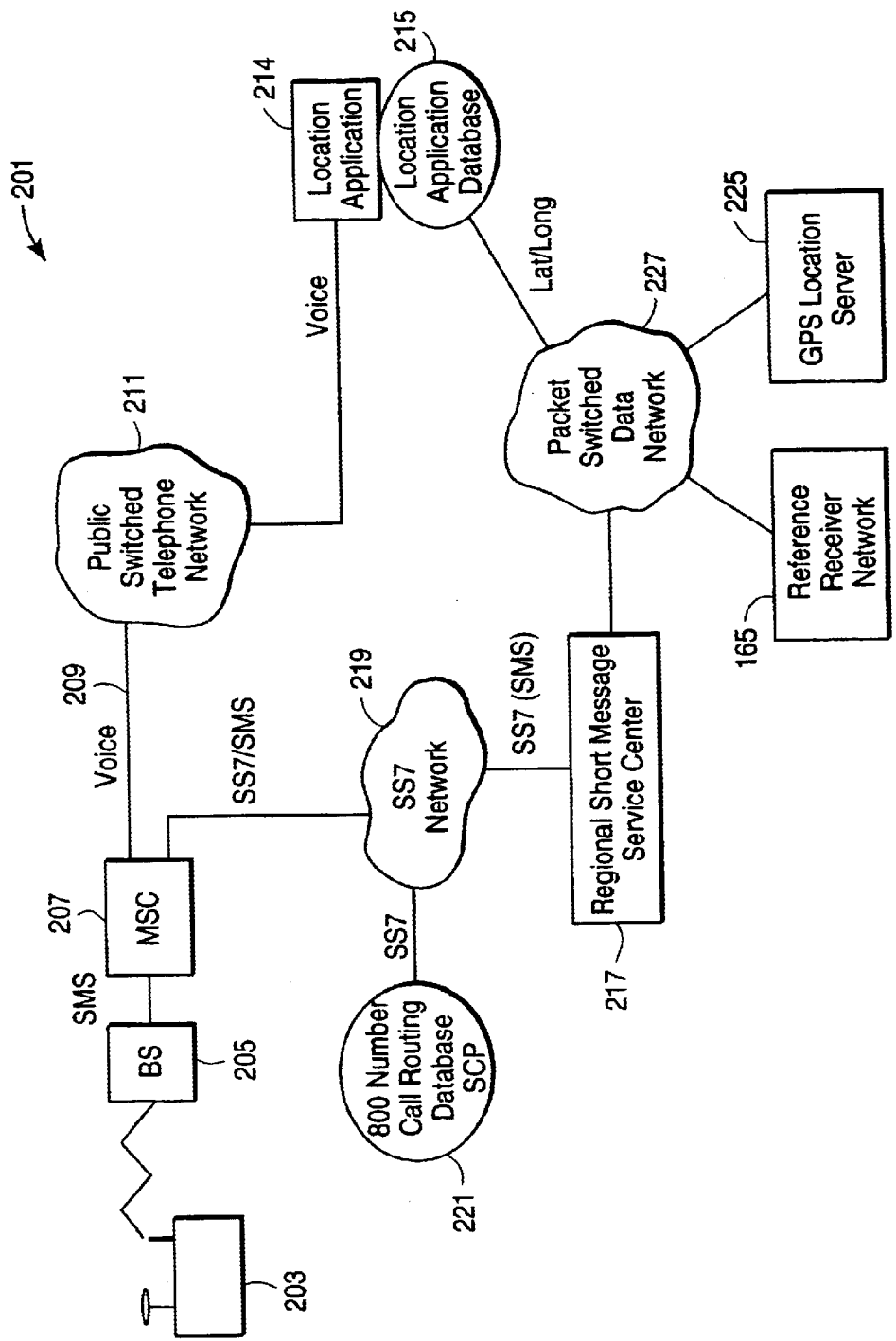
FIG. 7 shows an example of a distributed system for processing GPS information for a location-based service.

FIG. 7 shows an alternative example of a distributed location-based processing system. In this case, the location server performs services which may not be considered emergency services, such as E911 emergency services. For example, the location server 214 may perform dispatching services or concierge services for a user of the mobile GPS receiver 203. For example, the user of the mobile GPS receiver 203 may desire to know the location of three of the closest Italian restaurants and may place a call to the operators at the location server 214. The voice call is forwarded through the basestation 205 and the mobile switching center 207 through the PSTN 211 to the location-based application server 214. At the same time, the GPS location server 225 determines the location of the mobile GPS receiver 203 through the SS7 network 219 by transmitting short messages between the mobile GPS receiver 203 and the GPS location receiver 225. In this case, the messages are transmitted through the mobile switching center 207 and the SS7 network 219 and the regional SMSC 217 and the packet switched data network 227. In the example shown in FIG. 7, the GPS reference receiver network 165 is coupled to the network 227 to provide the satellite ephemeris data for the GPS location server. The database 221 which may be a database server, which is coupled to the SS7 network 219, performs call routing services. In this example, the user of the receiver 203 may dial a "1-800" phone number (in the United States) to access the location-based application server.

It will be appreciated that for both systems shown in FIGS. 6 and 7, additional location servers may be coupled to the data network and additional application servers may be coupled to communication networks in the same manner as shown in FIG. 2B or FIG. 2A.

Figure 8:
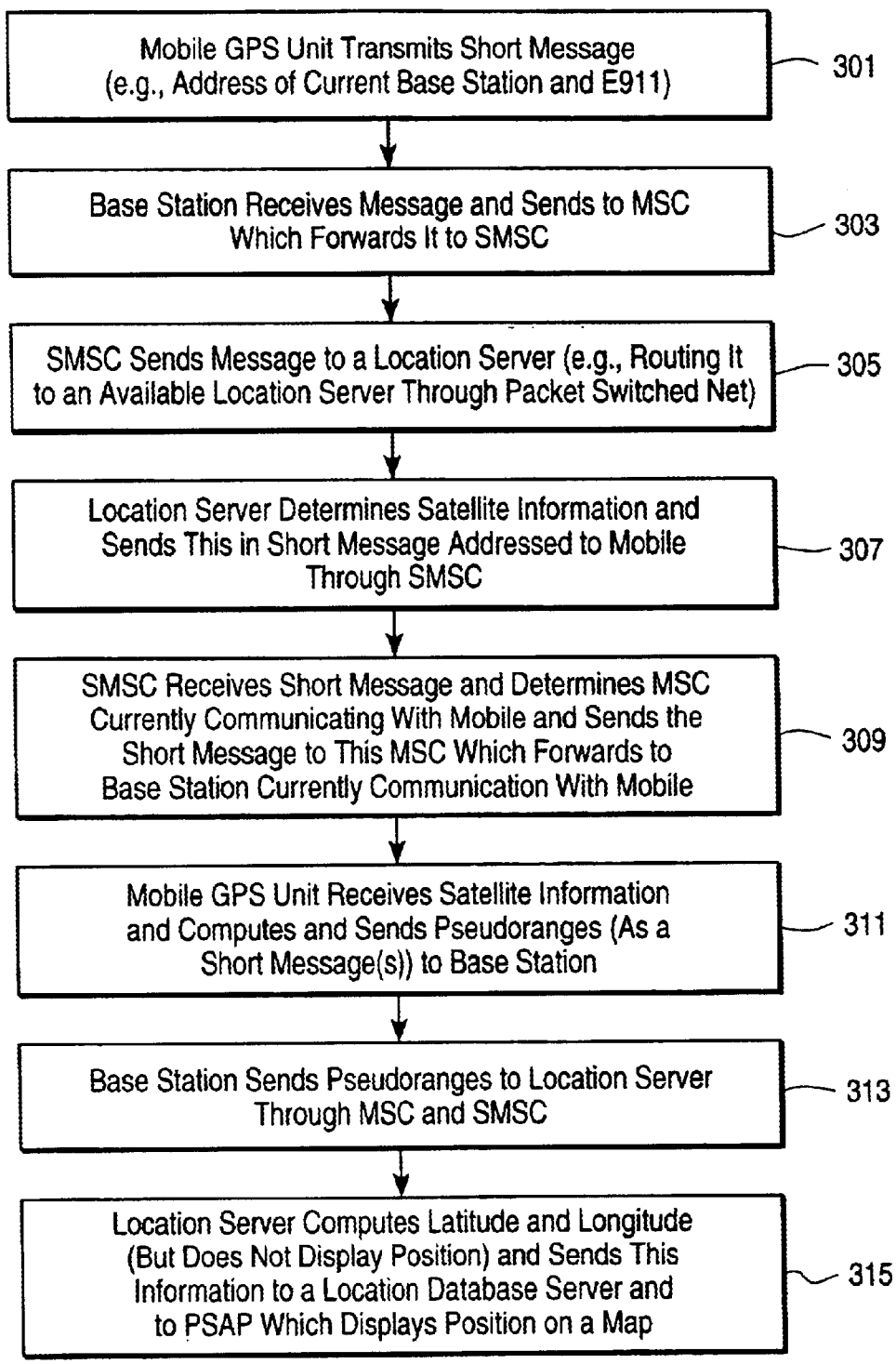
FIG. 8 is a flowchart which describes a method for using a distributed processing system to process GPS information in a "911 " situation.

FIG. 8 illustrates a method for operating a regional E911 distributed processing system, such as that shown in FIG. 6. In step 301, the mobile GPS unit transmits a short message which may include the address of the current basestation with which the mobile GPS unit is communicating and the E911 signal. This message will typically be addressed to the regional GPS location server. In step 303, a cell basestation receives the message and forwards it to the MSC which is coupled to the cell basestation which in turn forwards it to the regional short message service center which is coupled to the MSC. The SMSC sends this message to a location server by routing it to an available location server through a packet switched data network in one embodiment. The SMSC will typically include a routing table which specifies the available GPS location servers and this table may further include data received from those servers indicating the status of the servers; this status may indicate whether the server has failed or is congested and will thus allow the SMSC to route the message from the mobile unit to an available location server. The message from the mobile unit will typically include data, such as a cell sector ID or a basestation location or identification, which is typically used by a location server in one embodiment of the present invention. In step 307, the location server determines satellite information and sends this information in a short message addressed to the mobile unit through the SMSC. In one embodiment, this satellite information includes Doppler corrections for satellites in view and an identification of the satellites in view and may also include satellite ephemeris data for at least these satellites. This information is typically derived from a cell based information source (plus data from the location servers) as described in co-pending U.S. patent application Ser. Nos. 08/842,559 which was filed Apr. 15, 1997, and which is hereby incorporated herein by reference. In step 309, the SMSC receives the short message containing the satellite information and determines the MSC which is currently communicating with the mobile unit and sends the short message to this MSC which forwards the message to the basestation which is currently communicating with the mobile unit. In step 311, the mobile unit receives the satellite information and determines pseudoranges to the satellites in view. The pseudoranges are typically time-stamped to indicate the time when the pseudoranges were collected. The pseudoranges and the corresponding time stamp(s) are then sent to the basestation. In another embodiment, the time stamping may take place at the basestation communicating with the mobile unit. In step 313, the basestation forwards the pseudoranges and time stamp(s) to the location server through the MSC and the SMSC. Then in step 315, the location server computes a latitude and longitude but does not present this position information on a map or otherwise and then sends this information to a location database server and then to a PSAP which displays the position of the mobile unit on a map.

World-Wide Web Distribution of Location-Based Information

Figure 9:
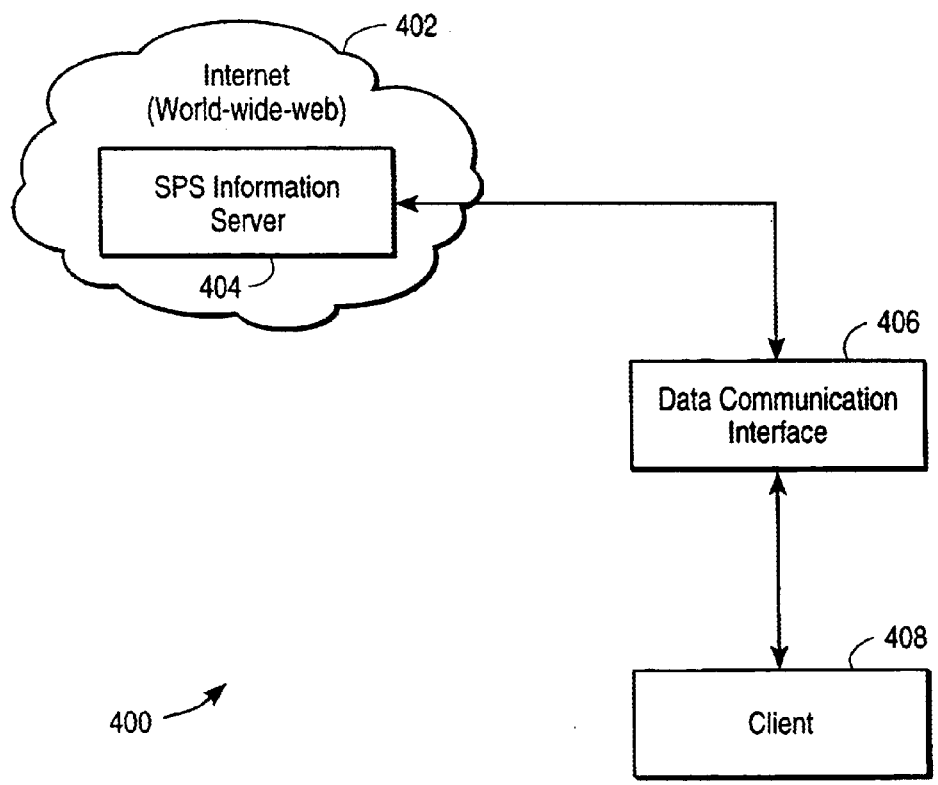
FIG. 9 is a block diagram of a system for exchanging location-based information via a computer network, such as the Internet, according to one embodiment of the invention.

FIG. 9 is a block diagram of a system for exchanging location-based information via a computer network, such as the Internet, according to one embodiment of the invention. A system 400 is shown, in which a location-based information Web server 404 is part of the Internet 402. The Internet generally represents a network of networks, and may include various types of data communication media (wires, wireless, cellular, etc.), switching devices, routing devices, network computers/servers, client computer systems, local area networks (LANs), wide area networks (WANs), etc. Such networks may use a variety of protocols to regulate the exchange of information, such as TCP/IP, ATM, etc. Internet access is typically granted to client computer systems by Internet service providers (ISPs). Access to the Internet may facilitate transfer of various types of information (e.g., email, data files, programs, media, etc.) between two or more digital processing systems.

The World-Wide Web (WWW), as the name implies, is a global network or "web" of systems and applications that provide relatively flexible utilization of the Internet for exchanging information. In a sense, the World-Wide Web represents an application of the Internet to combine ease-of-use with widespread connectivity and substantially universal access to the Internet and its resources. As such, a data processing system may connect to the Internet (e.g., through an ISP, a LAN gateway, etc.) at virtually any location and access global information and services provided through the World-Wide Web. Data exchange on the Internet typically uses TCP/IP protocols, and the WWW typically supports hypertext markup language (HTML) documents.

The SPS information server 404 represents one or a combination of data processing systems for receiving and/or transmitting information associated with SPS (e.g., GPS) signals, such as ephemeris, and/or location-based service information, such as weather, traffic, etc., via the Internet, and in one embodiment of the invention, the World-Wide Web. As such, the server 404 may represent one or a combination of a dedicated location-based information Web server, location server, application server, wide area reference network management server, etc.

The operation of the system 400 is now described according to one embodiment of the invention. A client, such as the client 408 shown in FIG. 9, may establish data communication with the Internet, and in particular, with the server 404, via a data communication interface 406, which enables Internet access, to obtain location-based information (i.e., information pertinent to a specific position or geographical area, typically corresponding to the location of the client 408). In one embodiment, the client 408 represents a mobile SPS unit, which may include an SPS receiver and a communication transceiver, and thus, may provide GPS measurements (e.g., pseudoranges) to the server 404. However, it will be appreciated that other client systems, which may not necessarily include SPS circuitry, may also access the server 404 to obtain location-based information therefrom. As such, a user may know and enter a geographical position/area of interest to access the location-based service and/or GPS signal-related information. The data communication interface represents one or combination of systems, media, and applications for providing Internet access to the client 408. As an example, the data communication interface 406 may represent a cellular, PSTN, digital circuit-switched, and/or packet-switched network that serves as a communication gateway through which the client 408 may establish connection to the Internet, and in particular, the server 404. Typically, the client 408 includes or is coupled to a modem and/or other communication interface. For example, the client 408 may include a wireless (e.g., cellular) or hardwired (e.g., PBX) communication interface to enable the client unit to establish connection to the Internet. On the other hand, the client 408 may include a network interface (e.g., an Ethernet card) to establish connection with the Internet, for example, through a LAN gateway or other interface.

In one embodiment, the client 408 may provide pseudo-range measurement data, raw GPS navigation messages, or other SPS signal-related information which may indicate its location to the server 404 and/or be used by the server 404 to determine its location. In response, the server 404 provides location-based service information and/or SPS-related information to the client. The client may select from a list of services and/or types of information, in one embodiment of the invention.

Table 1 shows some examples of the information that may be provided to the client 408 by the server 404 via the Internet, according to one embodiment of the invention. The first column shows some examples of location-based service information that may be made available to the client 408 via the Internet and the World-Wide Web. On the other hand, the second column shows some of the SPS-related information that may be made available to the client 408. One or both types of information may be provided to the client via the server. The information shown in Table 1 may be obtained by the server 404 via one or more GPS reference stations, a wide area reference network (WARN) of reference stations, weather/news databases, registration by certain Web sites, databases, businesses, etc. Typically, most of the SPS-related information is also tailored for the geographic area or position associated with the client, i.e., the SPS-related information is also location-based. At least a portion of the information shown in Table 1 may also be tagged with time, which, in the case of GPS, may be GPS time or derived from GPS time, and provided to the client as such. It will be appreciated that a subset of the information may be available in certain areas, times, implementations, etc. Furthermore, it will be appreciated that other types of location-based service information and/or SPS-related information may be provided in alternative embodiments of the invention.

TABLE 1

| LOCATION-BASED (SERVICE) INFORMATION | SPS-RELATED INFORMATION |
|---|---|
| Terrain information (e.g., elevation) | Satellite Ephemeris data |
| Weather | Satellite Almanac data |
| Routing Information | Velocity for client or other device |
| Road maps | Raw satellite navigation message data |
| Business directories | Differential corrections computed for location of interest |
| White pages | Doppler data computed for location of interest |
| Traffic information | SPS measurements (e.g., pseudoranges at a particular reference station, mobile/client receiver location, etc.) |
| Emergency service information/dispatch | Time (e.g., GPS time) |
| Links or information for local lodging, restaurants, other services | Position fix for the client or other device |
| Advertising and/or electronic commerce | Satellite Constellation at location of interest |
| Billing Information | Satellite position and/or velocity related information |
| Concierge Services | |
| GIS information | |

Figure 10:
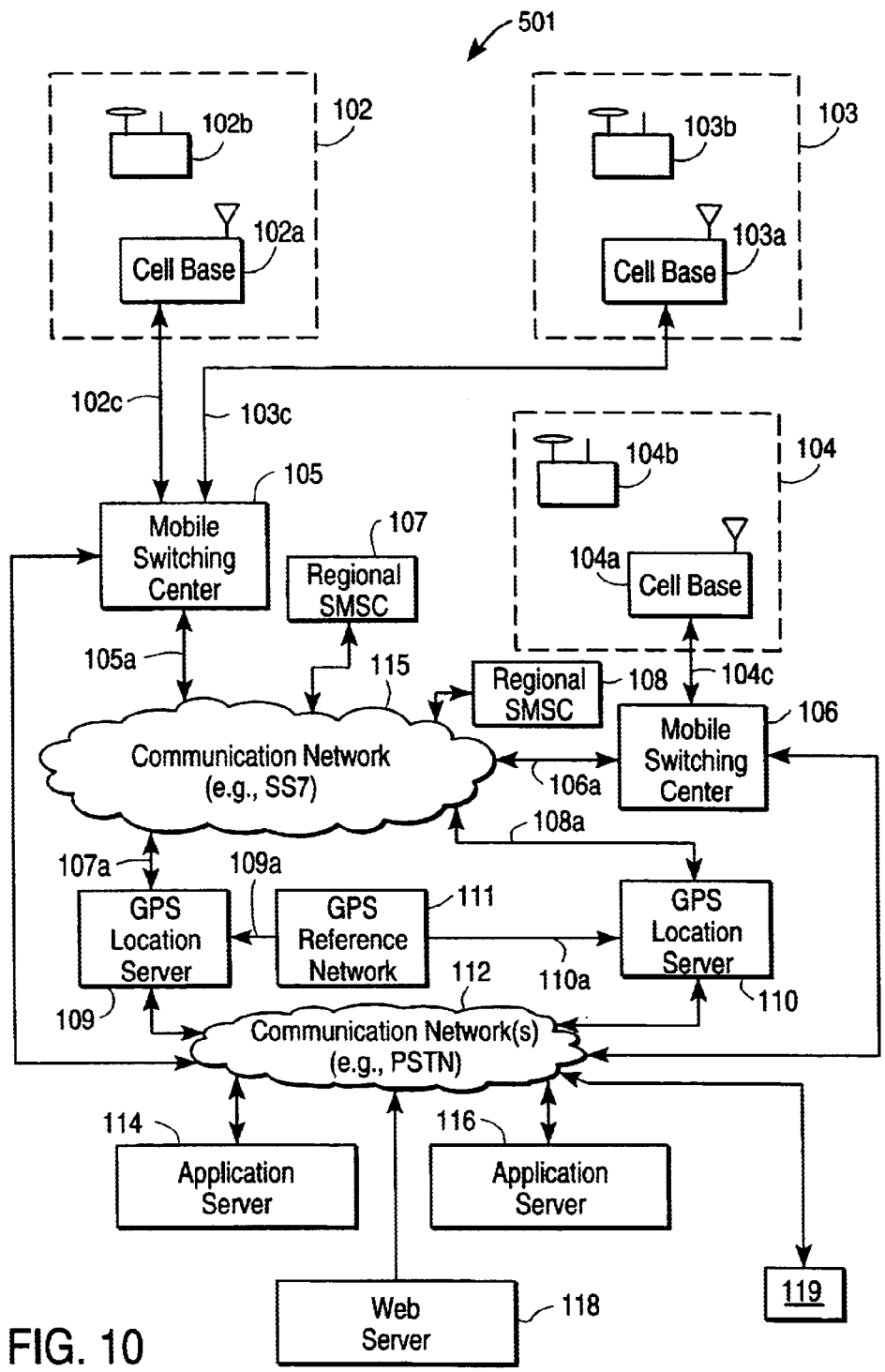
FIG. 10 is a block diagram of one example of a system architecture for providing location-based information via the Internet, according to one embodiment of the invention.

FIG. 10 is a block diagram of one example of a system architecture for providing location-based information via the Internet, according to one embodiment of the invention. The system 501 is similar to the system 101 shown in FIG. 2B, except that the system 501 includes a web server 118 to provide location-based information to mobile GPS units and/or other client devices through the Internet, and in particular, the World-Wide Web.

As described above with reference to FIG. 2B, either of the two GPS location servers may be used, in one embodiment, to determine the position of a mobile GPS receiver (e.g. receiver 102b) using GPS signals received by the mobile GPS receiver. For example, each GPS location server typically receives pseudoranges, raw GPS navigation message signals, or other GPS-related information from a mobile GPS receiver, as well as satellite ephemeris data and differential corrections from the GPS reference network, to calculate a position for the mobile GPS receiver. This position may be transmitted through the PSTN to one (or both) of the application servers where the position may be presented (e.g. displayed on a map) to a user of the application server. Normally, the GPS location server calculates but does not present (e.g. by display) the position at the GPS location server. An application server may send a request, for the position of a particular GPS receiver in one of the cells, to a GPS location server which then initiates a conversation with a particular mobile GPS receiver through the mobile switching center in order to determine or refine the position of the GPS receiver and report that position back to the particular application. In another embodiment, a position determination for a GPS receiver may be initiated by a user of a mobile GPS receiver; for example, the user of the mobile GPS receiver may press 911 on the cell phone to indicate an emergency situation at the location of the mobile GPS receiver and this may initiate a location process in the manner described herein; or the user may simply request a position fix from the network.

In addition, in accordance with one embodiment of the invention, location-based information, such as the information shown above in Table 1, may be provided to mobile GPS receivers and/or other clients by the Web server 118, which is shown coupled to the communication network 112. The communication network 112 represents one or a combination of various types of communication networks (e.g., PSTN, packet switched, etc.) through which a mobile GPS receiver or other client device can access the Web server 118, and the location-based information provided by the Web server 118 through the World-Wide Web. Thus, the communication network 112 may represent or be coupled to the Internet, and in particular, the World-Wide Web. The Web server 118 may obtain GPS-related information (e.g., ephemeris data, raw satellite navigational data message(s), almanac data, differential correction data, etc.) from the GPS reference network 111 and/or the location servers 109 and 110. The Web server 118 may also provide information about a client's location to the location servers, application servers, or other devices that may be coupled to or may access the Web server 118.

While the mobile GPS receivers 102B, 103B, and 104B may gain access to the Web server 118 through a cellular interface and related network(s), the client unit 119, which may be mobile and may also include a GPS receiver and/or a cellular or other wireless communication interface, is shown to represent a client unit which may form other types of connections to the Internet and the Web server 118. For example, the client unit 119 may be a personal digital assistant (PDA), laptop computer, smart phone, etc., which may enable a user to input known/estimated location and/or time information, or a mobile GPS receiver or GPS receiver integrated with a client device which also includes a modem to enable the client unit to login to the Web server 118, for example, through the World-Wide Web. Such access may be obtained through a wired (e.g., PSTN) and/or wireless (e.g., cellular) network or Quicknet interface and an Internet Service Provider (ISP) or a direct-dial-in to the Web server 118. As such, the client unit 119 may provide information associated with its location (e.g., pseudorange measurement, raw satellite navigational message(s), user provided location information, etc.) to the Web server 118. In response, the server web server 118 provides the client via the World-Wide Web location-based information/service, such as those shown in Table 1 above. For example, the Web server 118 may provide the client unit 119 with satellite ephemeris information, differential time/position correction information, etc., associated with its location or location of interest. In addition to such GPS-related navigational information, the Web server 118 may also provide location-specific services, such as weather, traffic, geographically-targeted commerce/advertising opportunity, etc.

In one embodiment, the Web server 118 (which may operate in conjunction with another server/device coupled thereto) may use the location of the mobile GPS receiver to derive representations (e.g., charts, graphs, etc.) of cellular use demographics, such as time and place of calls, location-based and/or time-based distributions, etc., which representations and data may be provided to cellular carriers (e.g., for network capacity analysis and design), government agencies, Web users, etc. Furthermore, the Web server 118 may display (e.g., on a map) the location of various mobile GPS clients with or without integrated receivers with or without time tags. Such information may be useful for advertising, customer/user profiles, location-targeted marketing, location-based billing, etc. Furthermore, mobile GPS receivers, desktop/portable computers, or other client units may be able to access through the World-Wide Web the location-based information provided by the Web server 118.

In one embodiment, the Web server 118 (which may operate in conjunction with another server/device coupled thereto, such as a reference station(s)) may determine the position of the mobile GPS receiver, based on receiving information related to its location (e.g., pseudoranges, digitized satellite navigation messages, information about a particular cellular site serving the mobile GPS receiver, etc.), and provide data indicating the position to the mobile GPS receiver. On the other hand, the mobile GPS receiver may receive data from the Web server 118 to aid the mobile GPS receiver itself to determine its position and/or other navigational information. In another embodiment, the Web server 118 may be an additional process running on the GPS location server or application server.

Figure 11:
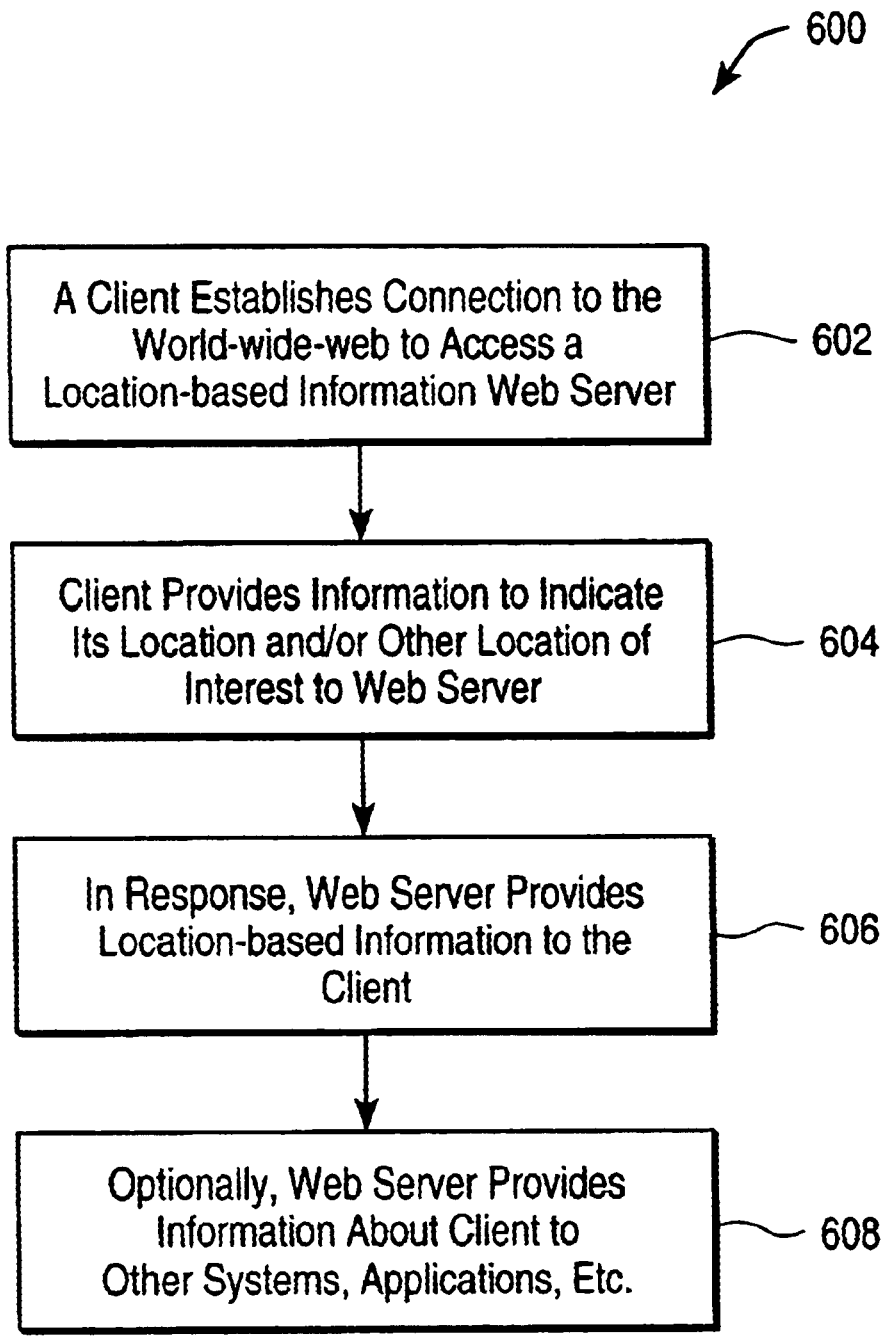
FIG. 11 is a flow diagram of a method for World-Wide Web distribution of location based information, according to one embodiment of the invention.

FIG. 11 is a flow diagram of a method for World-Wide Web distribution of location-based information, according to one embodiment of the invention.

At 602, a client (e.g., a digital processing system, a mobile GPS receiver, etc.) establishes connection to the Internet, and in particular, the World-Wide Web, to access a location-based information Web server, such as the Web server 118. For example, the client may access the Web server through a browser program which enables processing Web documents/sites by entering a domain name for the Web server, such as "www.snaptrack.com."

At 604, the client provides information indicative of its location and/or other location of interest to the Web server. For example, the Web server may provide a Web page which includes "fill-in" forms to enter values to indicate the position of the client and/or request an upload of GPS-related measurements, data, etc., such as pseudoranges, raw (digitized) satellite navigation messages, etc., to the Web server. In addition, it will be appreciated that the client may indirectly provide information about its location to the Web server. For example, the Web server or other device may determine information about the location of the client based on location or other characteristic of the interface through which the client has established communication with the Web server (e.g., a particular cell site location, a particular phone number, etc.).

At 606, in response to receiving information relating to the location of the client (and/or other location of interest), the Web server provides location-based information to the client, such as one or more of the location-based types of information mentioned above and shown in Table 1. For example, the Web server may provide GPS-related information, such as position/time corrections, differential corrections, ephemeris, raw navigation data, satellite constellation, satellite position and velocity, Doppler data, etc., to the client. The client may, in turn, use such information to determine navigational information (e.g., its position, velocity, time, etc.). Additionally, the Web server may provide location-specific services to the client, such as location-based traffic information, weather/terrain information, emergency dispatch, advertising for (local) businesses, opportunity for electronic commerce, reservation services (for local hotels, restaurants, etc.), routing/map information, etc.

At 608, the Web server may optionally use the information about the client, such as its location, time of log-on/call, etc., in various applications or provide the information to other systems applications. For example, as described above, the Web server and/or other device in communication therewith may use the location of the client to derive representations (e.g., charts, graphs, etc.) of cellular use demographics, such as time and place of calls, location-based and/or time-based distributions, etc., which representations and data may be provided to cellular carriers, government agencies, Web users, etc. Furthermore, the Web server may display (e.g., on a map) the location of various mobile GPS receivers/users with or without time tags. Such information may be useful for advertising, customer/user profiles, location-targeted marketing, etc. Furthermore, mobile GPS receivers, desktop/portable computers, or other clients may be able to access through the World-Wide Web the information about the client and/or other clients. Furthermore, a system receiving location-based information may use this information to decide if a particular service is allowed at the client's present location and/or time (and/or a location or time of interest).

Figure 12:
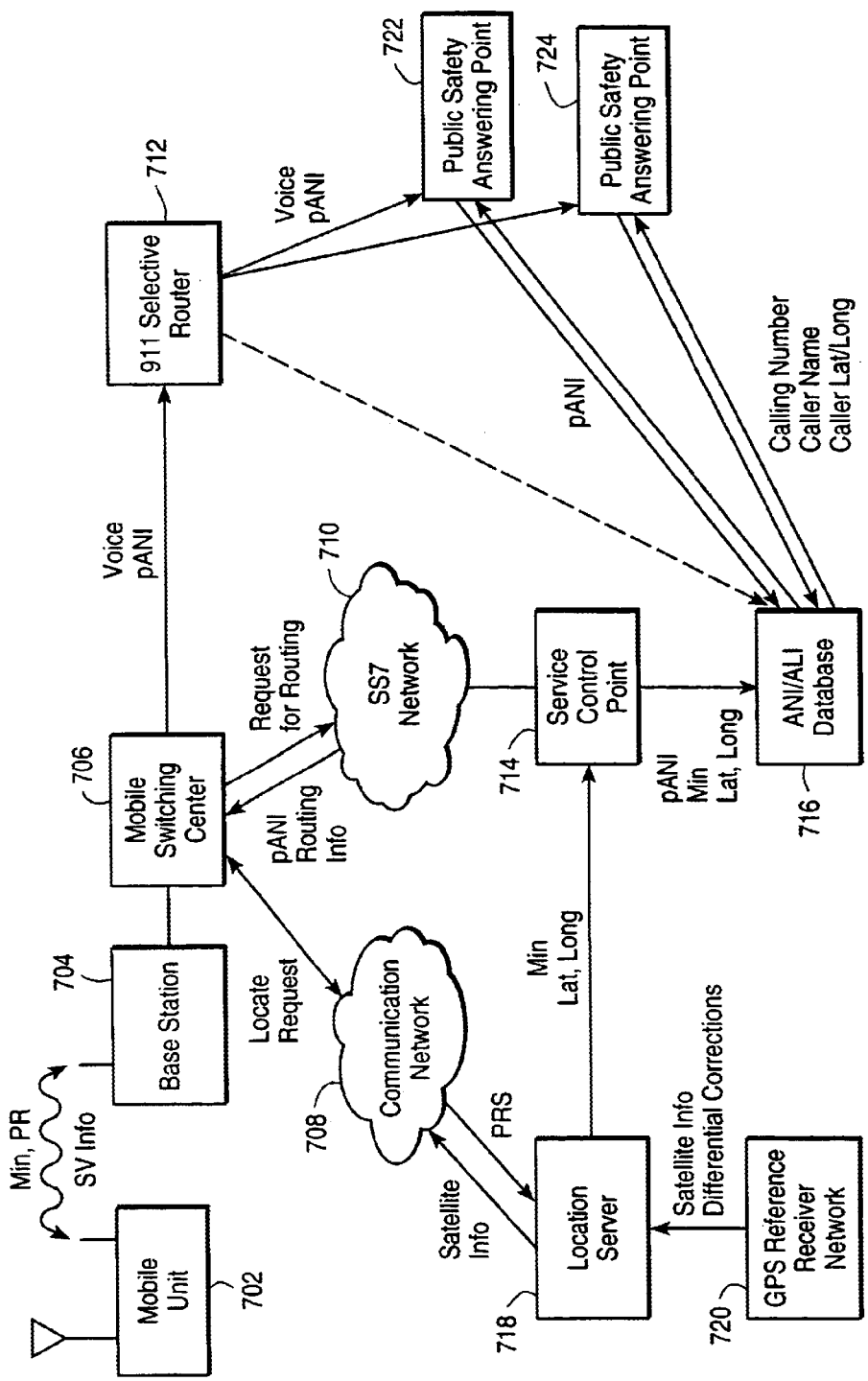
FIG. 12 is a diagram of a system configuration for providing a location-based emergency call routing application, according to one embodiment of the invention.

FIG. 12 is a diagram of a system configuration for providing a location-based emergency call routing application, according to one embodiment of the invention. It will be appreciated that the devices and/or applications shown in FIG. 12 may be linked by communication media that is hard-wired, wireless, or combination thereof. As shown, a mobile unit 702, which is typically a "location-enabled" mobile unit, may provide a mobile identification number (MIN) and pseudoranges (PR) to a basestation 704, and in turn receive satellite vehicle (SV) information via the basestation 704. A mobile switching center 706 is linked to the basestation 704.

When an emergency 911 call takes place, the call is routed to a public safety answering point (PSAP), such as the PSAP 722 or 724, to reduce response time. A SPS location server, such as the location server 718, may be used to provide information associated with the location of the mobile unit 702 to a 911 selective router 712. The SPS location server may be linked to a GPS reference network 720 and the mobile switching center 706 through a communication network 708. The selective router 712, in turn, uses the location information to route the voice calls. A service control point (SCP) 714, linked to an SS7 network 710, provides the information associated with the mobile unit (e.g., the MIN, location information such as longitude/latitude, etc.) to an automatic number and location identifier (ANI/ALI) database 716. The ANI/ALI database may be accessed by the PSAPs 722 and 724 in a "dip" (or request) process using a pseudo-automatic number identifier (pANI), which acts as a call identifier. The SCP 714 adds additional information to the ANI resulting in the pANI, which is particularly useful for a wireless application. For example, the additional information may include a cell basestation's ID, longitude, latitude, etc. Finally, a PSAP, such as the PSAP 724 or 722, receives the cellular number, caller name, and caller location (e.g., as longitude/latitude). In an alternative embodiment, the 911 selective router 712 may perform the dip.

Although some of the methods and apparatus of the present invention have been described with reference to GPS satellites, it will be appreciated that the teachings are equally applicable to positioning systems which utilize pseudolites or a combination of satellites and pseudolites. Pseudolites are ground based transmitters which broadcast a PN code (similar to a GPS signal) modulated on an L-band carrier signal, generally synchronized with GPS time. Each transmitter may be assigned a unique PN code so as to permit identification by a remote receiver. Pseudolites are useful in situations where GPS signals from an orbiting satellite might be unavailable, such as tunnels, mines, buildings or other enclosed areas. The term "satellite", as used herein, is intended to include pseudolite or equivalents of pseudolites, and the term GPS signals, as used herein, is intended to include GPS-like signals from pseudolites or equivalents of pseudolites.

In the preceding discussion the invention has been described with reference to application upon the United States Global Positioning Satellite (GPS) system. It should evident, however, that these methods are equally applicable to similar satellite positioning systems, and in, particular, the Russian Glonass system. The Glonass system primarily differs from GPS system in that the emissions from different satellites are differentiated from one another by utilizing slightly different carrier frequencies, rather than utilizing different pseudorandom codes. The term "GPS" used herein includes such alternative satellite positioning systems, including the Russian Glonass system.

In the foregoing specification, the invention has been described with reference to specific exemplary embodiments thereof. However, it will be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for providing information from a web server, said me ad comprising:
   receiving at said web server a request for information, said request being received over the Internet from a mobile communication device, said request not including position information of said mobile communication device;
   transmitting, from said web server to a location server, a request or a position of said mobile communication device;
   receiving from said location server said position of said mobile communication device and in response to receiving said position, providing, from said web server, information associated with said position to said mobile communication device.

2. The method of claim 1 wherein said mobile communication device comprises a Satellite Positioning System (SPS) receiver and a wireless communication system.

3. The method of claim 2 wherein said SPS receiver determines a plurality of pseudoranges to a corresponding plurality of SPS satellites and said wireless communication system transmits said plurality of pseudoranges or receipt by said location server.

4. The method of claim 3 wherein said location server transmits satellite information to said mobile communication device and wherein said SPS receiver receives said satellite information and determines said plurality f pseudoranges based on said satellite information.

5. The method of claim 3 wherein said location server receives said plurality of pseudoranges and determines said position of said mobile communication device based on said plurality of pseudoranges.

6. The method of claim 1 wherein said web server receives, from said location server, said position of said mobile communication device.

7. The method of claim 6 wherein said web server initiates said request for said position information in response to said request for information over said internet from said mobile communication device.

8. The method of claim 7 wherein said web server and said location server are logically distinct but physically co-located.

9. The method of claim 7 wherein said web server also functions an application server.

10. The method of claim 7 wherein said information associated with said position comprises location-based service information related to said position of said mobile communication device.

11. The method of claim 1 wherein said information associated with said position comprises SPS-related information related to said position of said mobile communication device.

12. The method of claim 1 wherein said information associated with said position of said mobile communication device includes GPS navigational information.

13. The method of claim 1 wherein said information associated with said position of said mobile communication device includes location-specific services.

14. The method of claim 1 wherein said information associated with said position of said mobile communication device includes representations of cellular use demographics.

15. The method of claim 1 wherein said information provided by said web server includes said position of said mobile communication device.

16. The method of claim 1 wherein said information associated with said position of said mobile communication device includes data to aid said mobile communication device itself to determine its position.

17. A method for providing information from a location server, said method comprising:
    receiving, at said location server, a request, from a web server, for a position of a mobile communication device, said request being initiate by said web server after receiving a request for information over the Internet from said mobile communication device, said request for information from said mobile communication device not including position information of said mobile communication device;
    transmitting from said location server to said web server said position of mobile communication device, wherein said web server uses said position to provide information associated with said position to said mobile communication device.

18. The method of claim 17 wherein said mobile communication device comprises a Satellite Positioning System (SPS) receiver and a wireless communication system.

19. The method of claim 18 wherein said SPS receiver determines a plurality of pseudoranges to a corresponding plurality of SPS satellites and said wireless communication system transmits said plurality of pseudoranges for receipt by said location server.

20. The method of claim 19 wherein said location server transmits satellite information to said mobile communication device and wherein said SPS receiver receives said satellite information and determines said plurality of pseudoranges based on said satellite information.

21. The method of claim 19 wherein said location server receives said plurality of pseudoranges and determines said position of said mobile communication device based on said plurality of pseudoranges.

22. The method of claim 21 wherein said web server and said location server are logically distinct but physically co-located.

23. A method in a mobile communication device for providing information, said method comprising:
    transmitting over the Internet a request to a web server for information, said web server, in response to said request, causing a location server to determine a position of said mobile communication device, said request not including position information of said mobile communication device;
    receiving information associated with said position of said mobile communication device, said receiving being in response to said web serve receiving said position which was requested from said location server.

24. The method of claim 23 wherein said mobile communication device comprises a Satellite Positioning System (SPS) receiver and a wireless communication system.

25. The method of claim 24 wherein said SPS receiver determines a plurality of pseudoranges to a corresponding plurality of SPS satellites and said wireless communication system transmits said plurality of pseudoranges for receipt by said location server.

26. The method of claim 25 wherein said location server transmits satellite information to said mobile communication device and wherein said SPS receiver receives said satellite information and determines said plurality of pseudoranges based on said satellite information.

27. The method of claim 25 wherein said location server receives said plurality of pseudoranges and determines said position of said mobile communication device based on said plurality of pseudoranges.

28. The method of claim 1 further comprising:
    determining at said web server whether a position of said mobile communication device is required to service said request for information;
    wherein said transmitting said request for a position of said mobile communication device is in response to a determination that a position of said mobile communication is required to service said request for information.

29. The method of claim 28 wherein said web server transmits said request for position of said mobile communication device through an application server; and, said application server performs service management.

30. The method of claim 29 wherein said service management comprises subscriber management.

* * * * *

US006677894C1

(12) EX PARTE REEXAMINATION CERTIFICATE (8513th)
United States Patent
Sheynblat et al.

(10) Number: US 6,677,894 C1
(45) Certificate Issued: Sep. 6, 2011

(54) METHOD AND APPARATUS FOR PROVIDING LOCATION-BASED INFORMATION VIA A COMPUTER NETWORK

(75) Inventors: Leonid Sheynblat, Belmont, CA (US); Norman F. Krasner, San Carlos, CA (US)

(73) Assignee: Snaptrack, Inc., San Jose, CA (US)

Reexamination Request:
No. 90/008,597, Apr. 18, 2007

Reexamination Certificate for:
Patent No.: 6,677,894
Issued: Jan. 13, 2004
Appl. No.: 09/201,672
Filed: Nov. 30, 1998

Related U.S. Application Data

(63) Continuation-in-part of application No. 09/067,406, filed on Apr. 28, 1998, now Pat. No. 6,185,427.

(51) Int. Cl.
*G01S 1/00* (2006.01)
*G01S 5/00* (2006.01)
*G01S 5/14* (2006.01)
*H04Q 7/22* (2006.01)

(52) U.S. Cl. .................. 342/357.46; 455/414.3; 455/456.3; 455/456.5

(58) Field of Classification Search .................. None
See application file for complete search history.

(56) References Cited

U.S. PATENT DOCUMENTS

| 4,457,006 | A | 6/1984 | Maine |
| 5,153,598 | A | 10/1992 | Alves |
| 5,245,634 | A | 9/1993 | Averbuch |
| 5,323,322 | A | 6/1994 | Mueller et al. |
| 5,365,447 | A | 11/1994 | Dennis |
| 5,396,540 | A | 3/1995 | Gooch |
| 5,412,388 | A | 5/1995 | Attwood |
| 5,420,883 | A | 5/1995 | Swensen et al. |
| 5,448,773 | A | 9/1995 | McBurney et al. |
| 5,485,163 | A | 1/1996 | Singer et al. |
| 5,491,486 | A | 2/1996 | Welles, II et al. |
| 5,515,062 | A | 5/1996 | Maine et al. |
| 5,519,760 | A | 5/1996 | Borkowski et al. |
| 5,751,244 | A | 5/1998 | Huston et al. |
| 5,774,829 | A | 6/1998 | Cisneros et al. |
| 5,812,087 | A | 9/1998 | Krasner |
| 5,841,396 | A | 11/1998 | Krasner |
| 5,913,170 | A | 6/1999 | Wortham |
| 5,928,306 | A | 7/1999 | France et al. |
| 5,952,969 | A | 9/1999 | Hagerman et al. |
| 5,960,341 | A | 9/1999 | Leblanc et al. |
| 5,973,643 | A | 10/1999 | Hawkes et al. |
| 5,982,324 | A | 11/1999 | Watters et al. |
| 5,999,124 | A | 12/1999 | Sheynblat |
| 6,002,363 | A | 12/1999 | Krasner |
| 6,088,594 | A | 7/2000 | Kingdon et al. |
| 6,091,956 | A | 7/2000 | Hollenberg |
| 6,131,067 | A | 10/2000 | Krasner et al. |
| 6,199,045 | B1 | 3/2001 | Giniger |
| 6,208,290 | B1 | 3/2001 | Krasner |
| 6,411,811 | B2 * | 6/2002 | Kingdon et al. .......... 455/456.5 |

FOREIGN PATENT DOCUMENTS

| DE | 4424412 | 12/1994 |
| EP | 0242099 | 10/1987 |
| EP | 0379198 | 7/1990 |
| EP | 0444738 | 9/1991 |
| EP | 0449798 | 10/1991 |
| EP | 0512789 | 11/1992 |

(Continued)

*Primary Examiner*—Woo H. Choi

(57) ABSTRACT

Methods and apparatuses for distributing location-based information (i.e., information specific to a client's location or a location of interest to the client) to a client, which may be a mobile SPS receiver, via the Internet and in particular, the World-Wide Web. The client provides information about its location and/for a location of interest to a Web server. The Web server, based on the information, provides via the Internet information relating to the client's location or location of interest to the client.

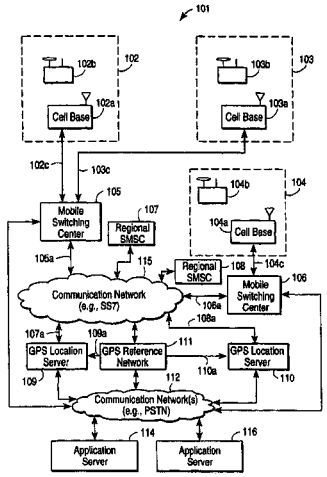

FOREIGN PATENT DOCUMENTS

| | | |
|---|---|---|
| EP | 0545636 | 5/1993 |
| EP | 0601293 | 5/1994 |
| EP | 0604404 | 6/1994 |
| EP | 0 785 535 | 7/1997 |
| FR | 2761837 | 9/1998 |
| GB | 2264837 | 9/1993 |
| GB | 2273218 | 5/1994 |
| GB | 2308033 | 5/1997 |
| JP | H9-311177 | 12/1997 |
| WO | 9615636 | 5/1996 |
| WO | 9714049 | 4/1997 |
| WO | 97/14054 | 4/1997 |
| WO | 9853573 | 11/1998 |

\* cited by examiner

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claim 14 is confirmed.

Claims 1-13 and 15-30 are cancelled.

New claim 31 is added and determined to be patentable.

*31. The method of claim 1, wherein providing, from said web server, information associated with said position to said mobile communication device comprises obtaining the information by the web server via registration to a web site.*

\* \* \* \* \*